(12) United States Patent
Lee et al.

(10) Patent No.: US 7,666,743 B2
(45) Date of Patent: Feb. 23, 2010

(54) METHODS OF FABRICATING SEMICONDUCTOR DEVICES INCLUDING TRANSISTORS HAVING RECESSED CHANNELS

(75) Inventors: Jin-Woo Lee, Gyeonggi-do (KR); Tae-Young Chung, Gyeonggi-do (KR); Sung-Hee Han, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 11/704,872

(22) Filed: Feb. 9, 2007

(65) Prior Publication Data
US 2008/0001230 A1   Jan. 3, 2008

(30) Foreign Application Priority Data
Jun. 28, 2006   (KR) .................... 10-2006-0058818

(51) Int. Cl.
*H01L 21/336* (2006.01)
(52) U.S. Cl. .................... 438/270; 257/E21.655
(58) Field of Classification Search ............... 438/270; 257/330, 331, 334, E29.201, E21.655
See application file for complete search history.

(56) References Cited

U.S. PATENT DOCUMENTS

| 6,844,591 B1 * | 1/2005 | Tran ............... 257/330 |
| 7,217,623 B2 | 5/2007 | Kim et al. |
| 2001/0023960 A1 * | 9/2001 | Soga et al. .......... 257/330 |
| 2005/0173759 A1 * | 8/2005 | Kim et al. ............ 257/331 |
| 2005/0245024 A1 | 11/2005 | von Schwerin |
| 2006/0056228 A1 | 3/2006 | Schloesser et al. |

FOREIGN PATENT DOCUMENTS

| KR | 10-2005-0079270 A | 8/2005 |
| KR | 10-2005-0106306 A | 11/2005 |

OTHER PUBLICATIONS

Notice of Decision to Grant Patent with English language translation, Korean App. No. 10-2006-0058818, Apr. 8, 2008.

* cited by examiner

*Primary Examiner*—Lex Malsawma
*Assistant Examiner*—Robert Huber
(74) *Attorney, Agent, or Firm*—Myers Bigel Sibley & Sajovec

(57) ABSTRACT

Semiconductor devices including an isolation layer on a semiconductor substrate are provided. The isolation layer defines an active region of the semiconductor substrate. The device further includes an upper gate electrode crossing over the active region and extending to the isolation layer and lower active gate electrode. The lower active gate electrode includes a first active gate electrode extending from the upper gate electrode to the active region and a second active gate electrode below the first active gate electrode and having a greater width than a width of the first active gate electrode. The device further includes a lower field gate electrode that extends from the upper gate electrode to the isolation layer and has a bottom surface that is at a lower level than a bottom surface of the active gate electrode such that the sidewalls of the active region are covered below the lower active gate electrode. Related methods of fabricating semiconductor devices are also provided herein.

14 Claims, 21 Drawing Sheets

METHODS OF FABRICATING SEMICONDUCTOR DEVICES INCLUDING TRANSISTORS HAVING RECESSED CHANNELS

CLAIM OF PRIORITY

This application is related to and claims priority from Korean Patent Application No. 2006-0058818, filed Jun. 28, 2006, in the Korean Intellectual Property Office, the disclosure of which is hereby incorporated herein by reference as if set forth in its entirety.

FIELD OF THE INVENTION

The present invention generally relates to semiconductor devices and, more particularly, to semiconductor devices including transistors and related methods.

BACKGROUND OF THE INVENTION

Semiconductor devices may use discrete devices, such as a field effect transistors (FETS), as switching devices. In the transistor, an on-current formed in a channel between source and drain regions of the device typically determines the operating speed of the device. Normally, a planar-type transistor may be provided by forming a gate electrode and source/drain regions on a substrate on which a device will be formed, for example, an active region. A typical planar-type transistor has a planar channel between the source/drain regions. The on-current of the planar-type transistor is typically proportional to a width of the active region, and is typically inversely proportional to a distance between the source and drain regions, i.e., a gate length. Thus, in order to increase the operating speed of a device by increasing the on-current, a length of a gate is typically decreased, and a width of an active region is typically increased. However, increasing the width of the active region in the planar-type transistor may increase the overall size of the device, which may be incompatible with the trend in the semiconductor fabrication industries to develop semiconductor devices of increasingly higher integration density.

Furthermore, the planar-type transistor may experience a short channel effect when a distance between source and drain regions in the planar-type transistor is shortened. Therefore, generation of the short channel effect typically must be effectively suppressed in order to provide a transistor having a short channel length suitable for a next generation semiconductor device. However, since a conventional planar-type transistor, where a channel is formed in parallel with the surface of a semiconductor substrate, is a flat-type channel device, the structure may be unfavorable to the scale-down of the device, and it may be difficult to suppress generation of the short channel effect as well.

To address the problems of the short channel effect, and scale down the transistor, a transistor having a recessed channel has been proposed. The recessed channel transistor may include a recessed channel region and an insulated gate electrode. The recessed channel transistor may provide a relatively effective channel length compared to that of a planar-type transistor. In other words, the recessed channel transistor may provide a structure capable of solving the problems due to the short channel effect. However, the recessed channel transistor may have unfavorable defects compared to the planar-type transistor, such as an increased threshold voltage and/or operating speed.

SUMMARY OF THE INVENTION

Some embodiments of the present invention provide semiconductor devices including an isolation layer on a semiconductor substrate. The isolation layer defines an active region of the semiconductor substrate. The device further includes an upper gate electrode crossing over the active region and extending to the isolation layer and lower active gate electrode. The lower active gate electrode includes a first active gate electrode extending from the upper gate electrode to the active region and a second active gate electrode below the first active gate electrode and having a greater width than a width of the first active gate electrode. The device further includes a lower field gate electrode that extends from the upper gate electrode to the isolation layer and has a bottom surface that is at a lower level than a bottom surface of the active gate electrode such that the sidewalls of the active region are covered below the lower active gate electrode.

In further embodiments of the present invention, the lower field gate electrode may include a first field gate electrode and a second field gate electrode below the first field gate electrode. The second field gate electrode may have a greater width than a width of the first field gate electrode. An upper surface of the second field gate electrode may be higher than a bottom surface of the second active gate electrode.

In still further embodiments of the present invention the second field gate electrode may have a larger width than a width of the first active gate electrode. The second field gate electrode may have a larger width than a width of the second active gate electrode.

In some embodiments of the present invention, the lower field gate electrode may cover at least one sidewall of an active region located on both sides of the lower active gate electrode.

In further embodiments of the present invention, a first impurity region and a second impurity region may be provided in an active region located on both sides of the first upper gate electrode. The first impurity region and the second impurity region may have an asymmetric structure. The first impurity region may have a shallow junction structure relative to a junction structure of the second impurity region. The first impurity region may have an impurity density lower than an impurity density of the second impurity region.

In still further embodiments of the present invention, a high density channel impurity region may be provided below the second impurity region. The high density channel impurity region may have a different conductivity type from a conductivity type of the first and second impurity regions. The high density channel impurity region may have an impurity density higher than an impurity density of a channel region below the first impurity region.

In some embodiments of the present invention a data storage element electrically connected to the first impurity region may be provided in the semiconductor device.

Although embodiments of the present invention are primarily discussed above with respect to semiconductor devices, methods of fabricating semiconductor devices are also provided herein.

DETAILED DESCRIPTION OF EMBODIMENTS OF THE INVENTION

Figure 1:
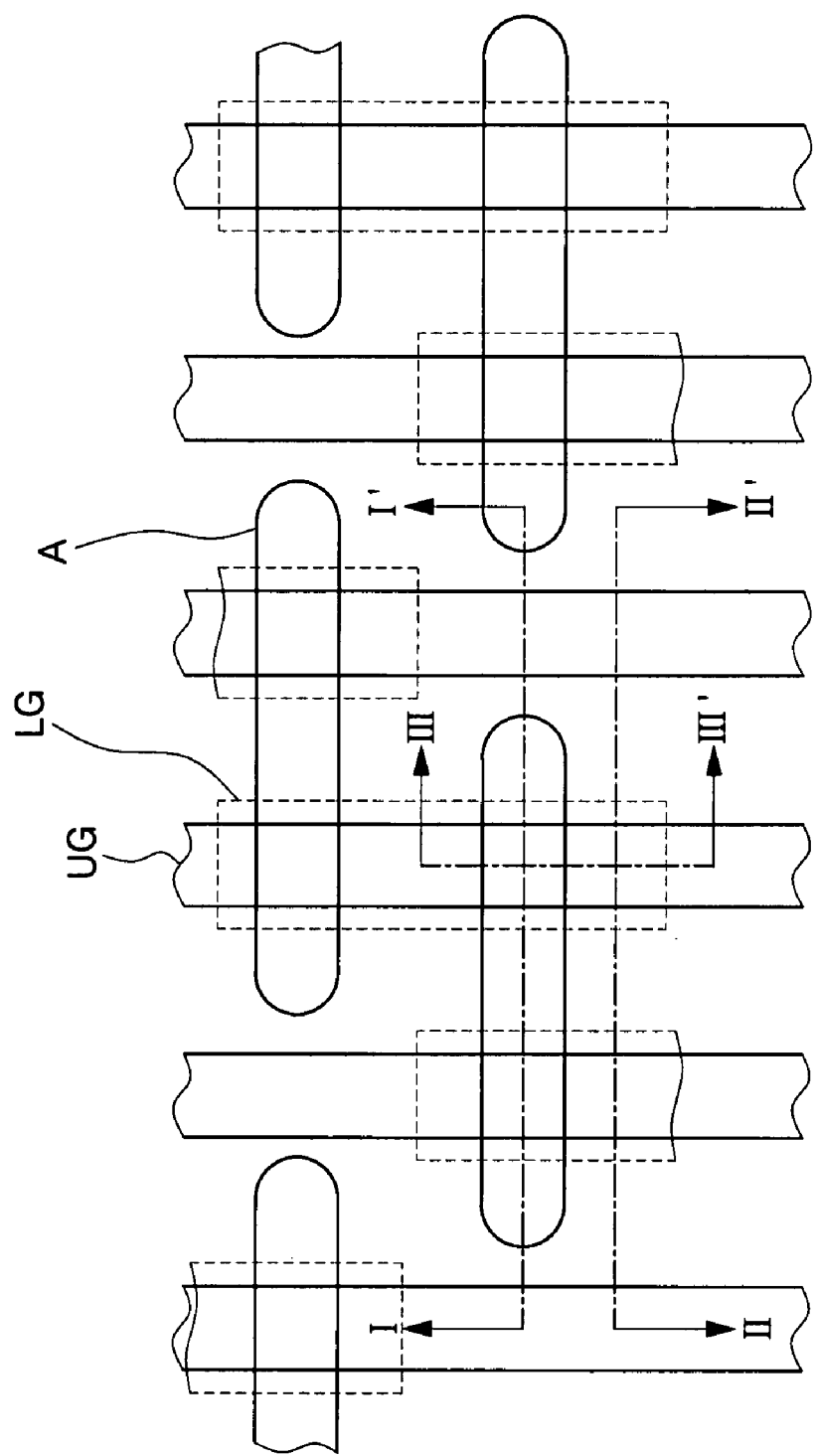
FIG. 1 is a plan view of semiconductor devices according to some embodiments of the present invention.
Figure 2A:
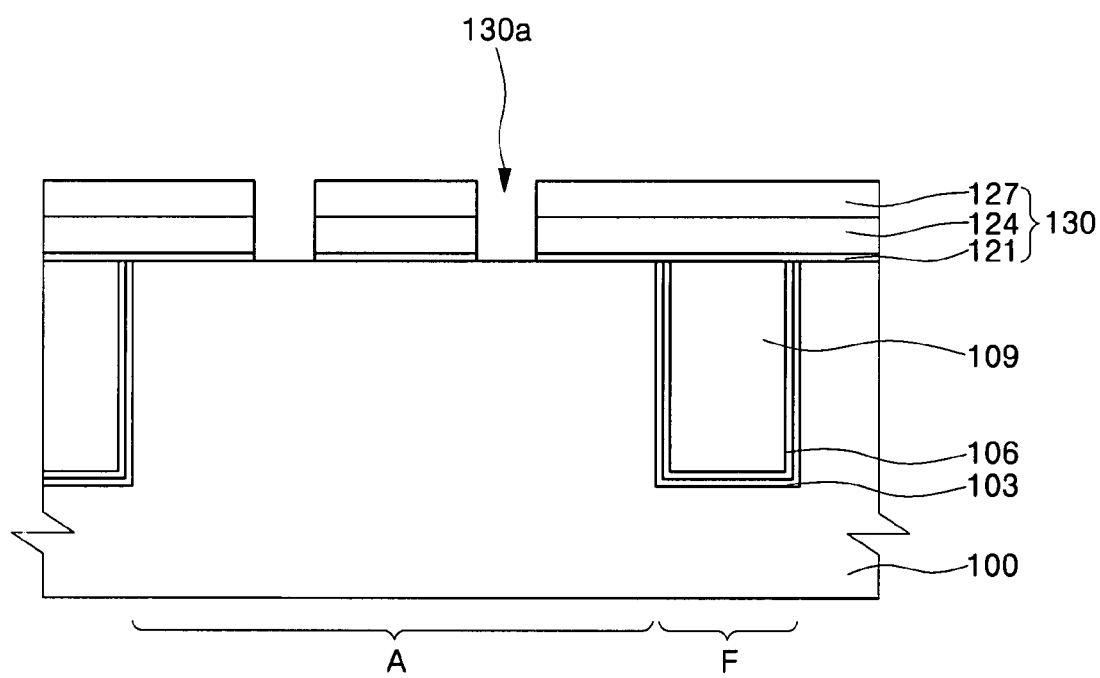
FIGS. 2A through 6C, and FIG. 7 are cross-sections illustrating semiconductor devices according to some embodiments of the present invention.
Figure 2B:
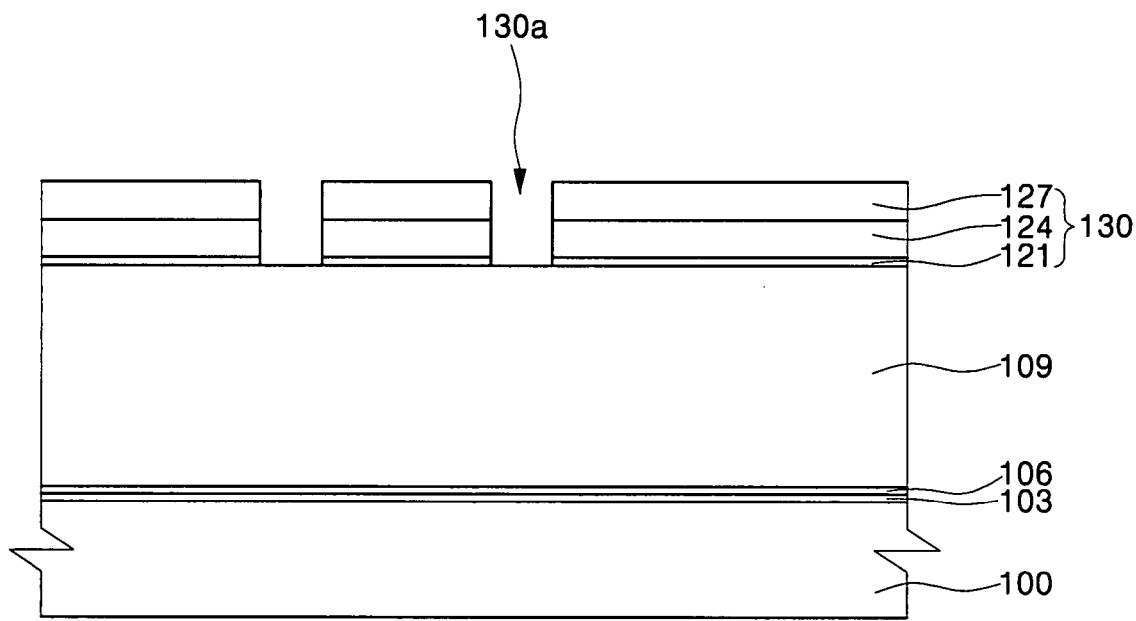
Figure 2C:
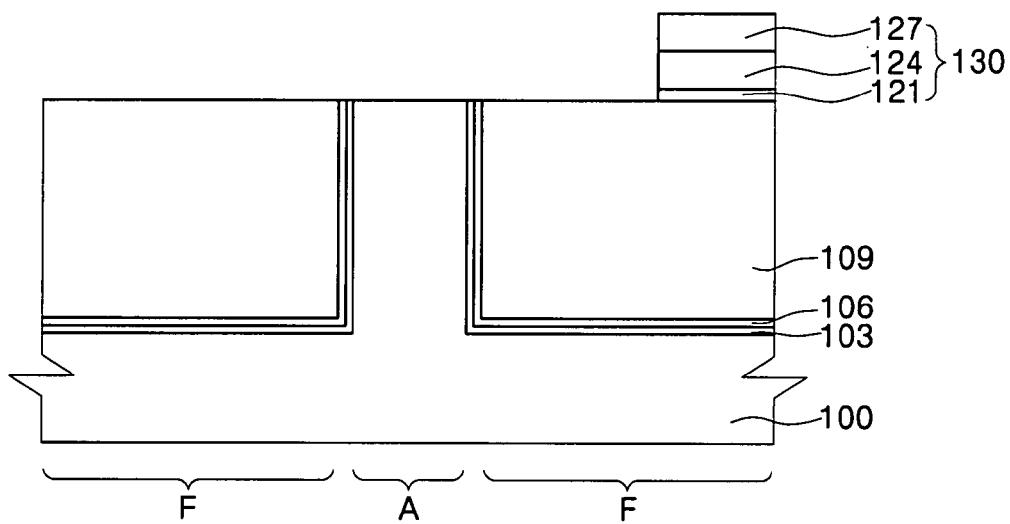
Figure 3A:
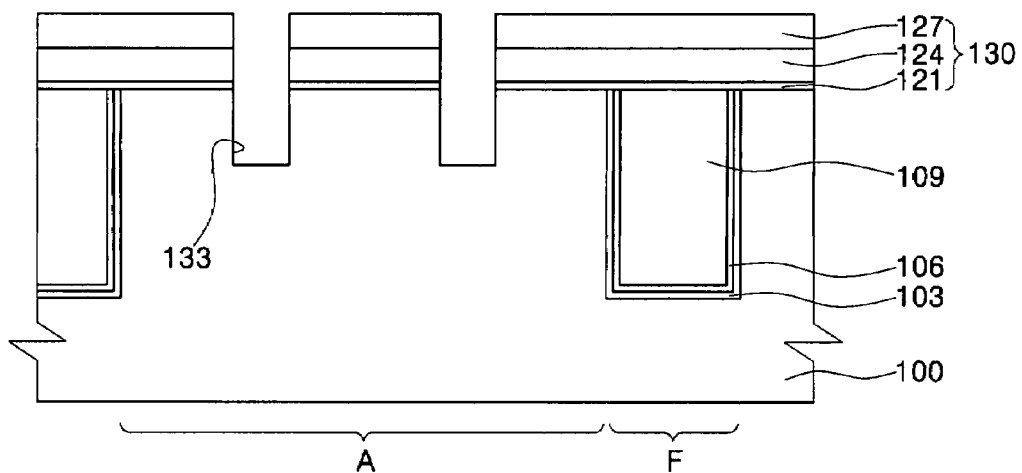
Figure 3B:
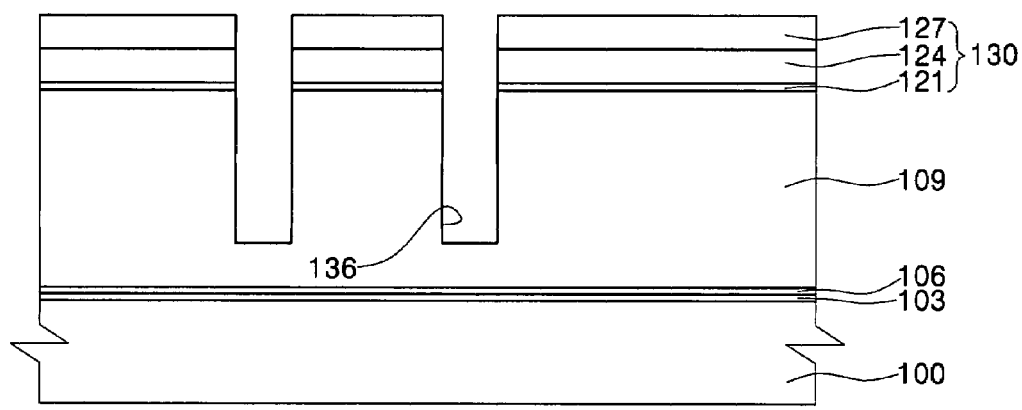
Figure 3C:
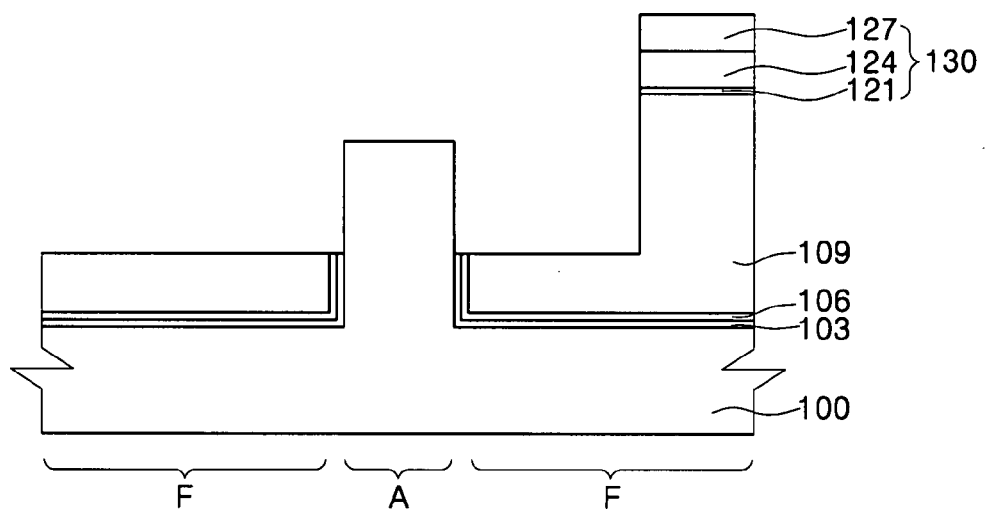
Figure 4A:
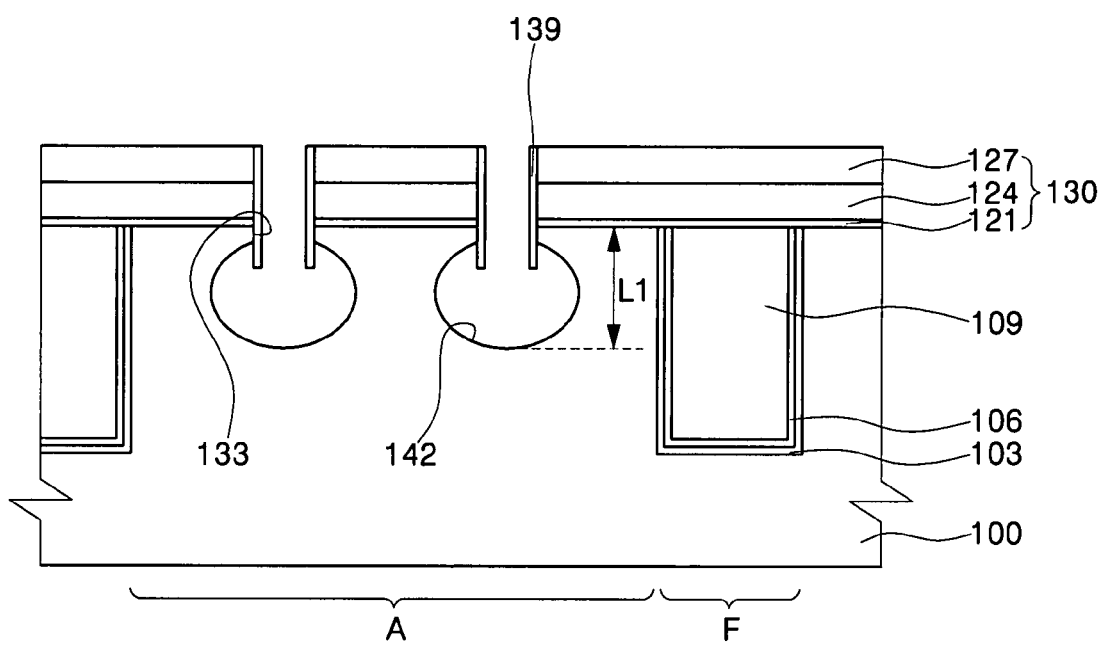
Figure 4B:
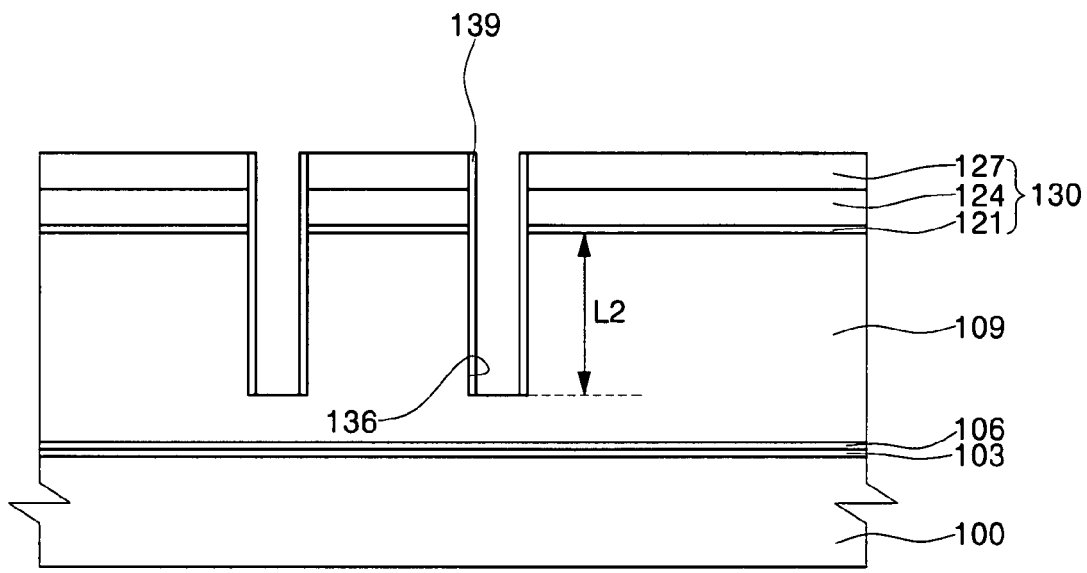
Figure 4C:
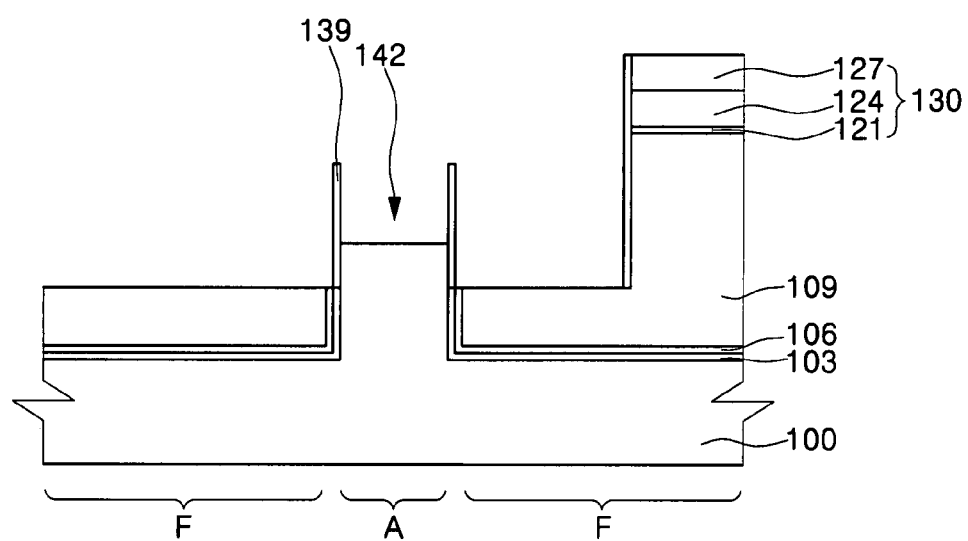
Figure 5A:
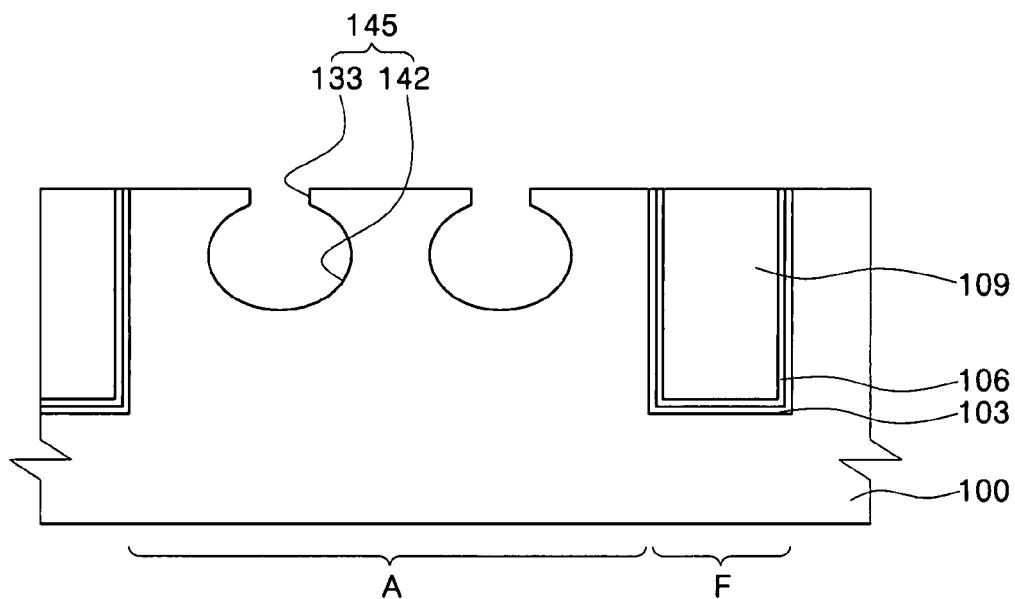
Figure 5B:
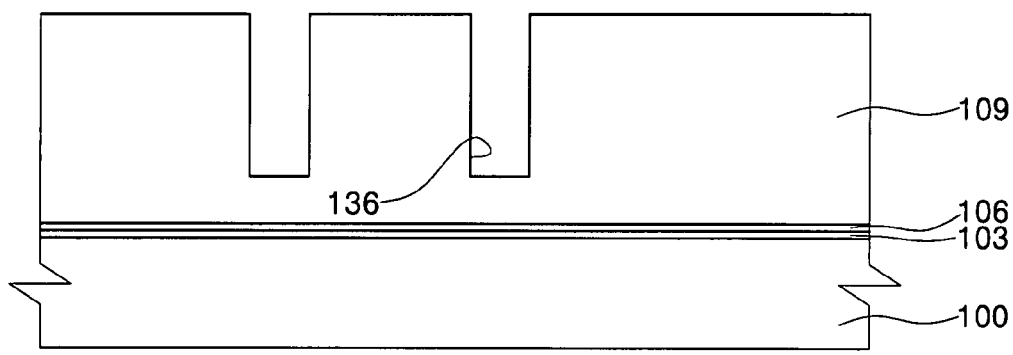
Figure 5C:
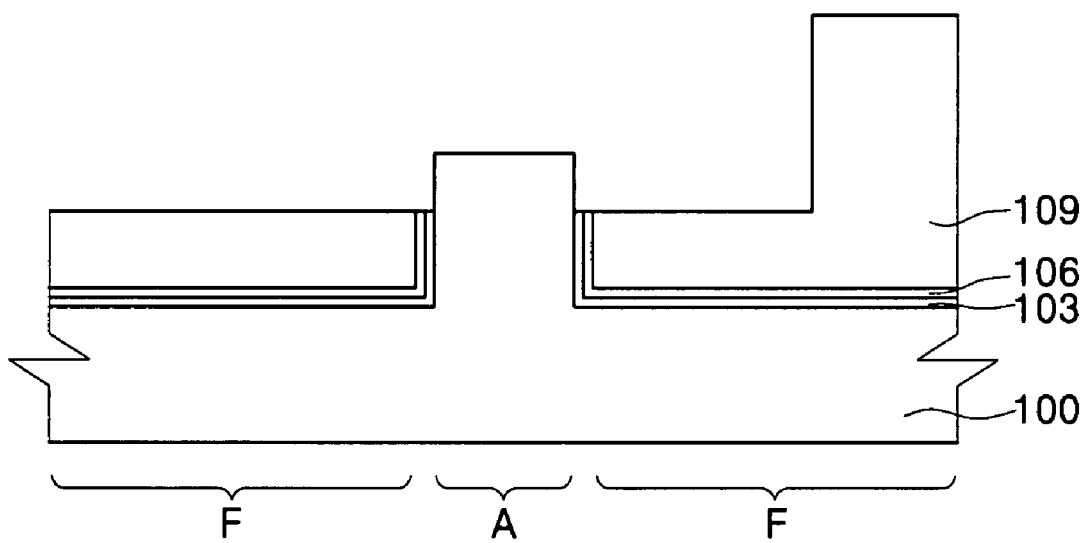
Figure 6A:
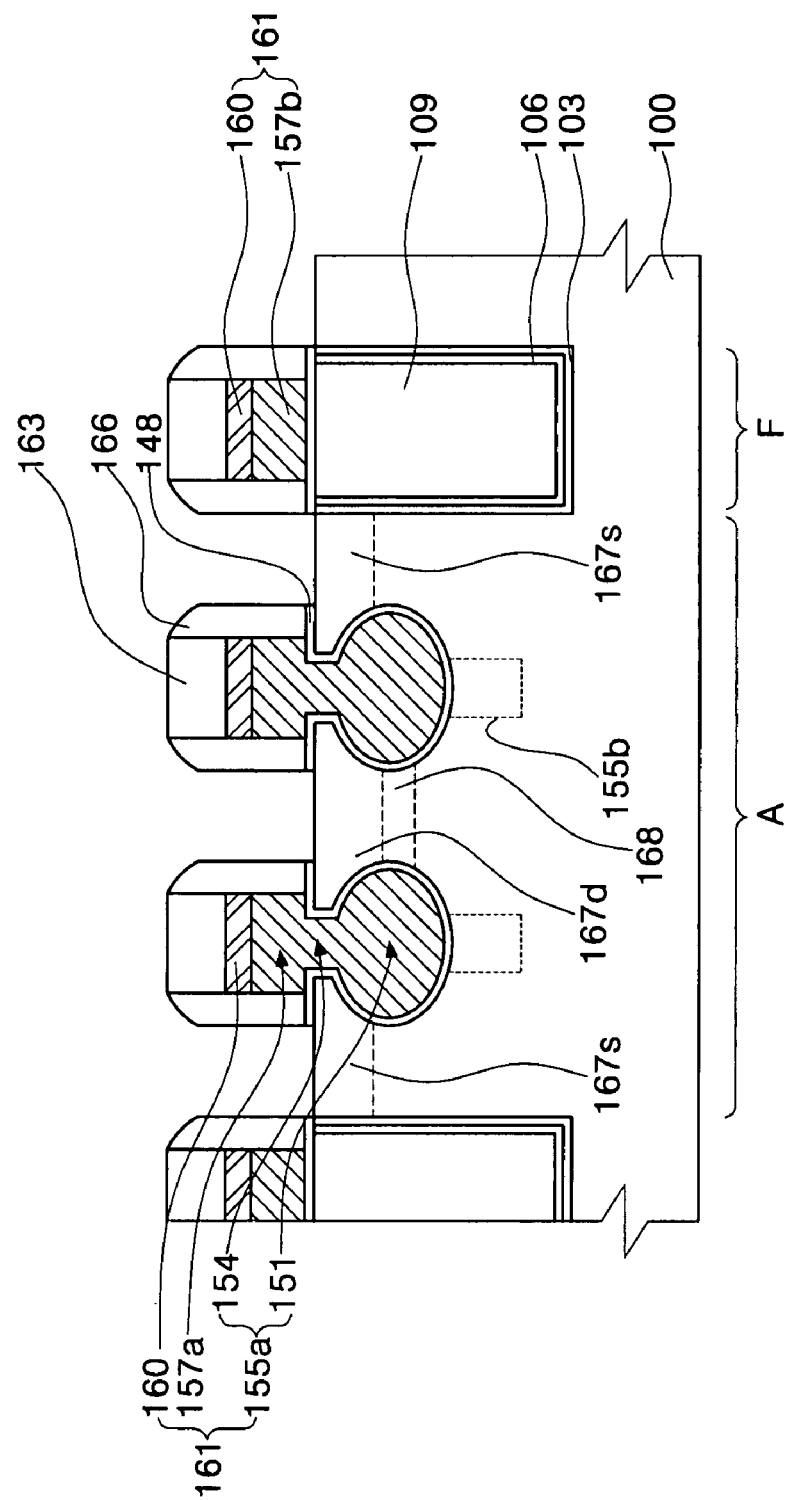
Figure 6B:
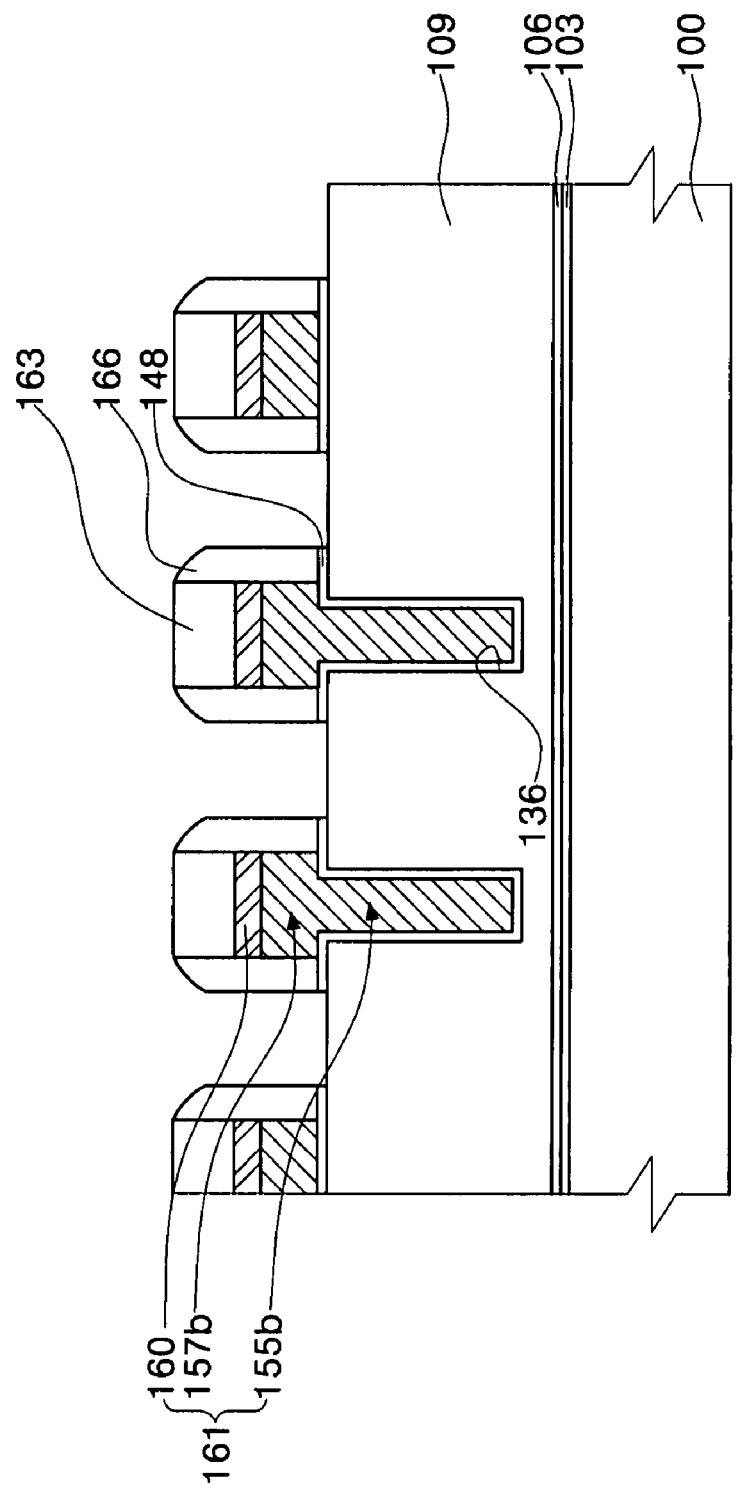
Figure 6C:
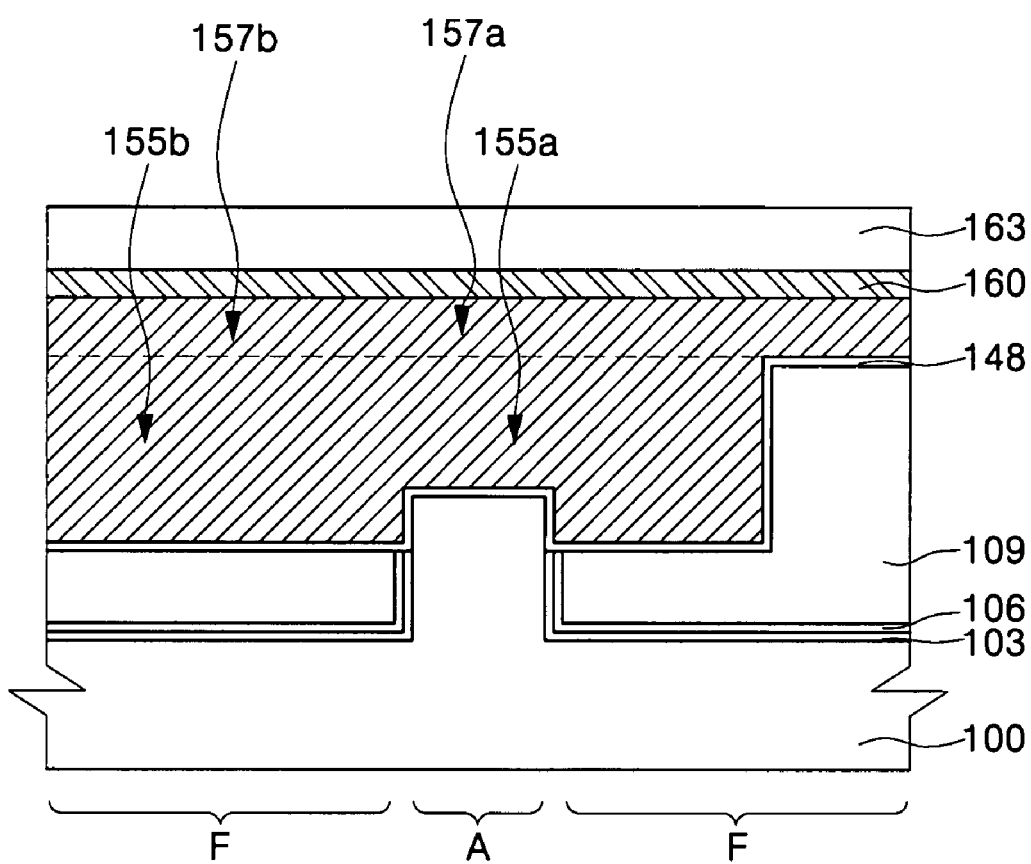

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 11A:
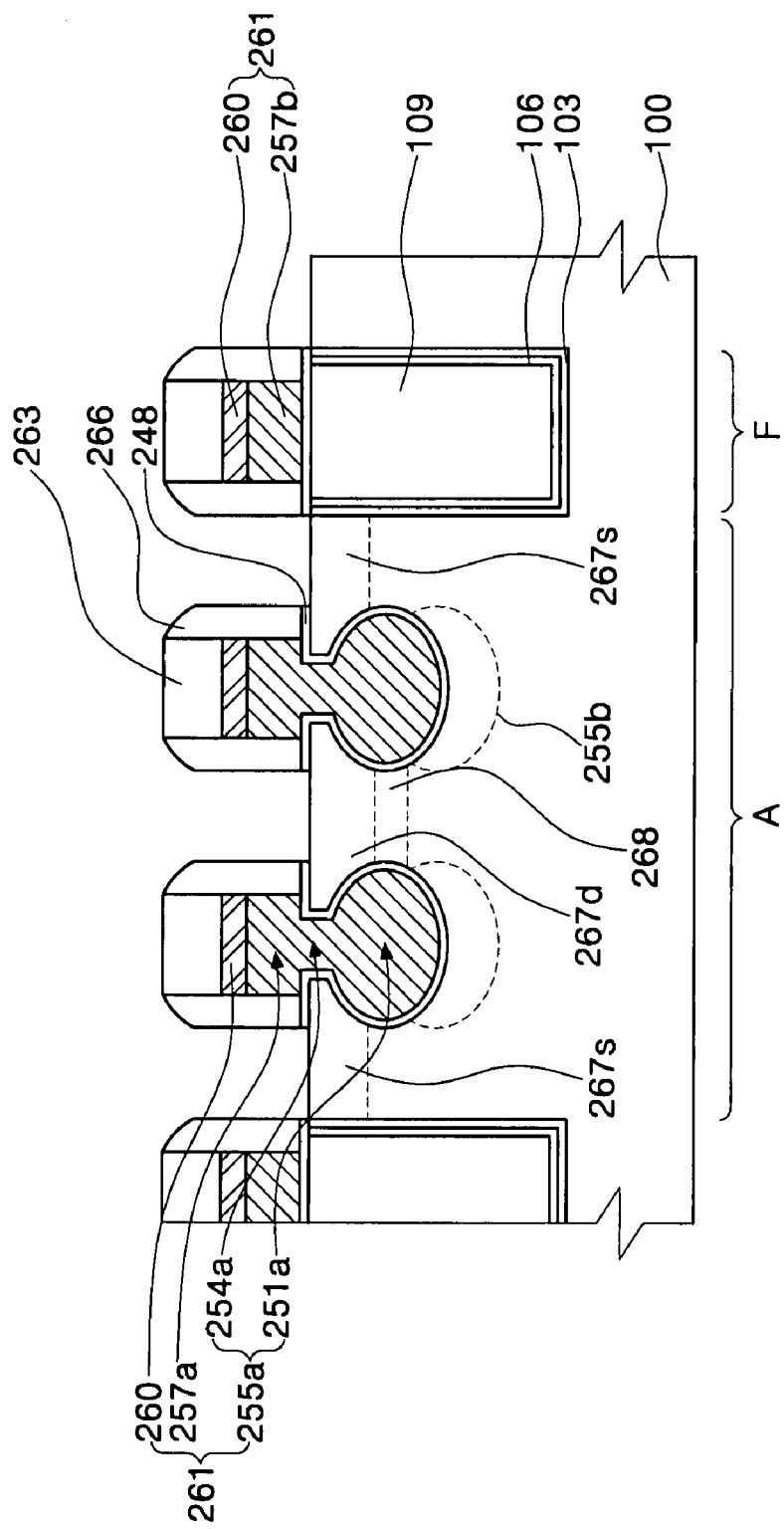
Figure 11B:
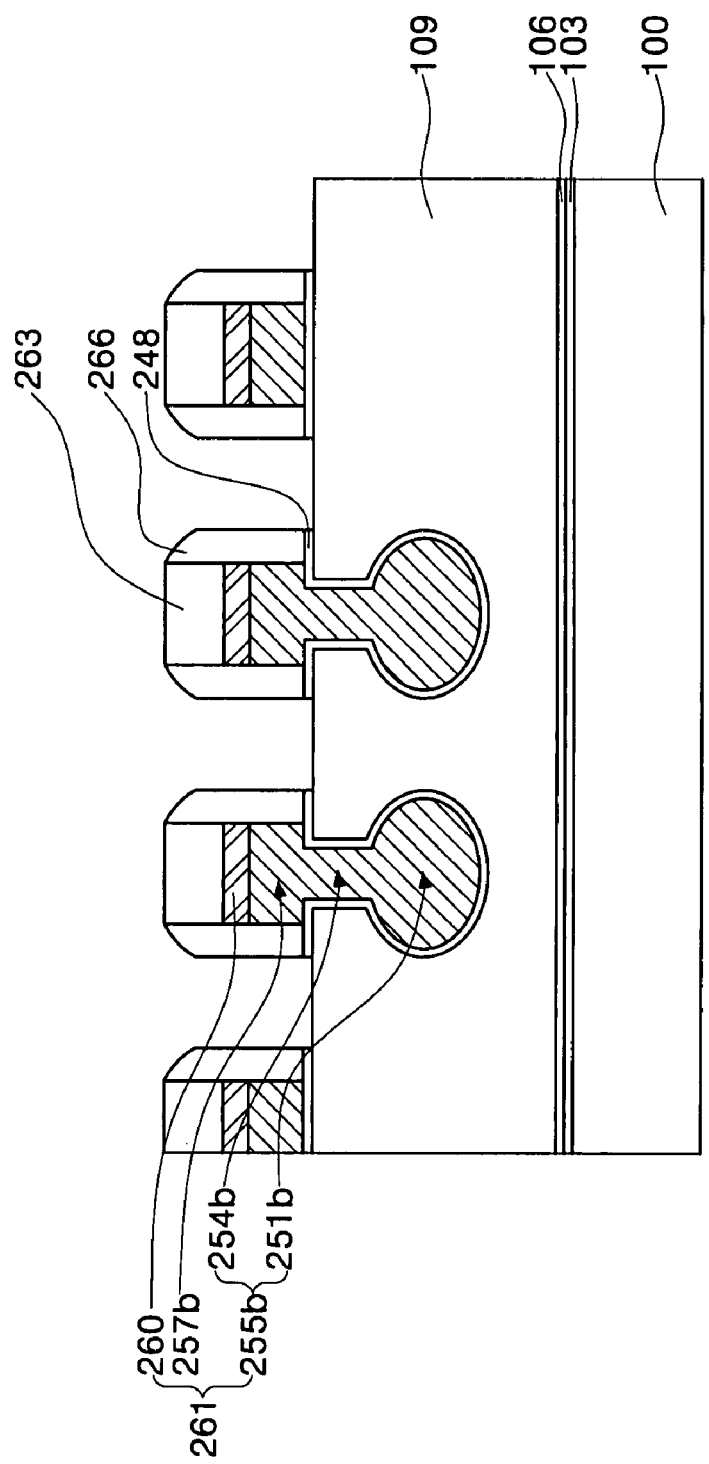
Figure 11C:
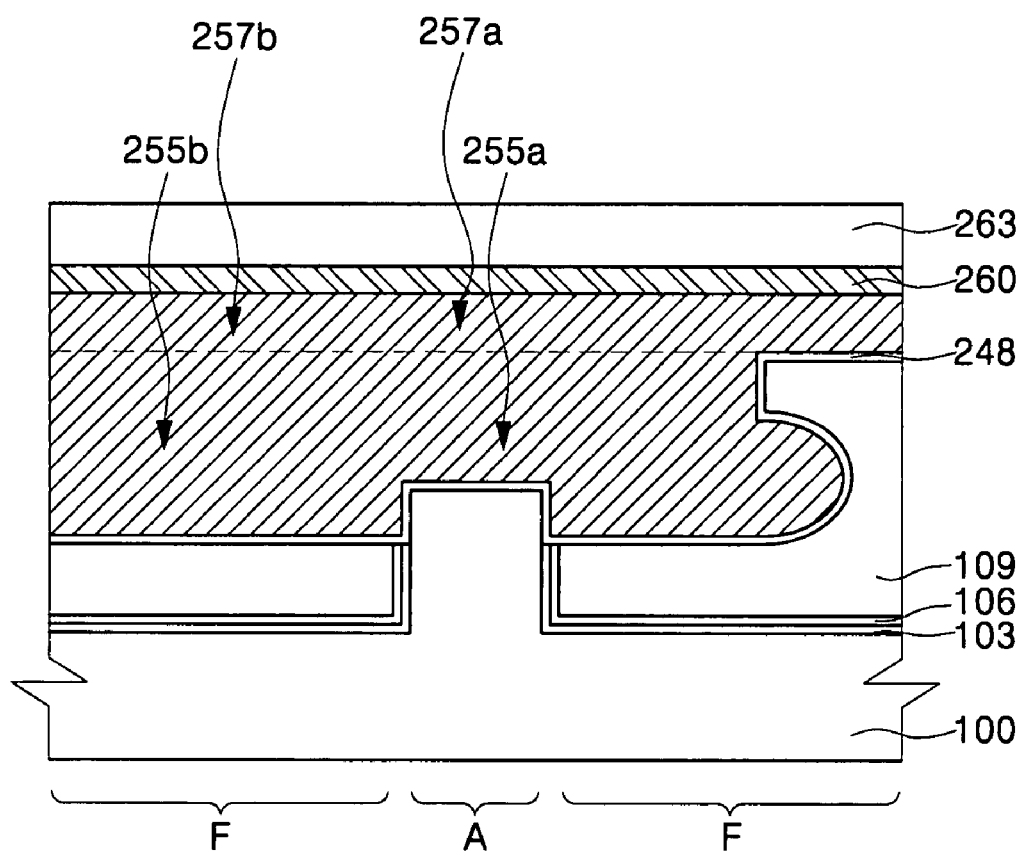
Figure 12:
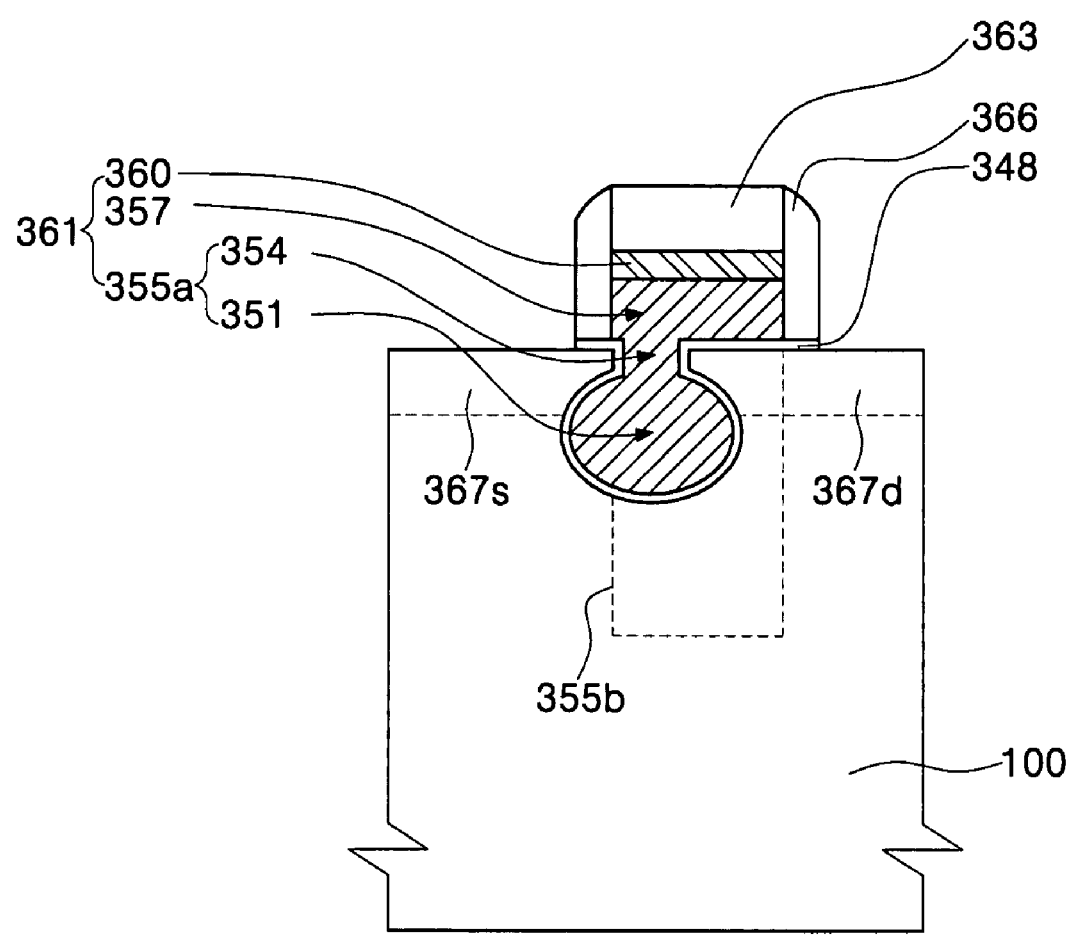
FIG. 12 is a cross-section illustrating semiconductor devices according to some embodiments of the present invention.

FIG. 1 is a plan view of a semiconductor device according to some embodiments of the present invention, FIGS. 2A through 6C and FIG. 7 are cross-sections of semiconductor devices according to some embodiments of the present invention, FIGS. 8A through 11C are cross-sections of semiconductor devices according to some embodiments of the present invention, and FIG. 12 is a cross-section of semiconductor devices according to some embodiments of the present invention. Furthermore, FIGS. 2A, 3A, 4A, 5A, 6A, 7, 8A, 9A, 10A, 11A and 12 are cross-sections taken along line I-I' of FIG. 1, FIGS. 2B, 3B, 4B, 5B, 6B, 8B, 9B, 10B and 11B are cross-sections taken along line II-II' of FIG. 1, and FIGS. 2C, 3C, 4C, 5C, 6C, 8C, 9C, 10C and 10C are cross sections taken along line III-III' of FIG. 1.

Referring first to FIGS. 1 and 6A through 6C, semiconductor devices according to some embodiments of the present invention will be discussed. As illustrated in FIGS. 1 and 6A through 6C, an isolation layer 109 is provide on a semiconductor substrate 100. The semiconductor substrate has an active region A and a field region F. The isolation layer 109 may be provided in the semiconductor substrate of the field region F, so as to define a plurality of active regions A. In some embodiments of the present invention, the isolation layer 109 may be a shallow trench isolation layer. The active regions A may be provided to have a major axis and a minor axis, and the active regions A may be aligned two-dimensionally in the major axis direction and the minor axis direction.

An insulating liner 106 may be provided between the isolation layer 109 and the semiconductor substrate 100. The insulating liner 106 may be include an insulating layer, such as a silicon nitride layer. A buffer-oxide layer 103 may be provided between the insulating liner 106 and the semiconductor substrate 100. The buffer oxide layer 103 may include an insulating layer, such as a silicon oxide layer.

Upper gate electrodes UG, which cross the active region A and extend to the isolation layer 109, may be provided. In some embodiments of the present invention, the upper gate electrode UG provided on the active region A is defined as an upper active gate electrode 157a, and the upper gate electrode UG provided on the isolation layer 109 is defined as an upper field gate electrode 157b.

A lower active gate electrode 155a is provided. The lower active gate electrode 155a includes a first active gate electrode 154, which extends from the upper active gate electrode 157a into the substrate of the active region A, and a second active gate electrode 151, which is located below the first active gate electrode 154 and has a greater width than that of the first active gate electrode 154. For example, the second active gate electrode 151 may have a circular shape as illustrated in the cross-section of FIG. 6A. Thus, the electric field crowding phenomenon between the second active gate electrode 151 and the active region A may be suppressed. Furthermore, since the second active gate electrode 151 has a width greater than that of the first active gate electrode 154, the transistor may have an increased effective channel length.

A lower field gate electrode 155b may be provided that extends from the upper field gate electrode 157b to the isolation layer 109. The lower field gate electrode 155b has a bottom surface that is at the level lower than that of the second active gate electrode 151 so as to cover the sidewalls of the active region located below the second active gate electrode 151. Thus, the active region located below the second active gate electrode 151 may have a fin structure.

The lower active gate electrode 155a and the lower field gate electrode 155b may form a lower gate electrode LG. A metal layer 160 may be disposed on the upper active gate electrode 157a and the upper field gate electrode 157b. The metal layer 160 may include, for example, a cobalt (Co) layer, a tungsten (W) layer, a titanium (Ti) layer, a nickel (Ni) layer, or a metal silicide layer. The upper gate electrode UG, the lower gate electrode LG, and the metal layer 160 may form a gate electrode 161. The upper active gate electrode 157a, the lower active gate electrode 155a, the upper field gate electrode 157b, and the lower field gate electrode 155b may include, for example, a conductive layer, such as a polysilicon layer.

A gate electrode located between the active regions A aligned in the major-axis direction may be an upper field gate electrode 157b. A gate dielectric layer 148 may be provided between the gate electrode 161 and the semiconductor substrate 100. The gate dielectric layer 148 may include, for example, a silicon oxide layer or a high-k dielectric layer.

First and second impurity regions 167s and 167d may be provided in the active region located at both sides of the gate electrode 161. The first impurity region 167s and the second impurity region 167d may have an asymmetric structure. For example, the first impurity region 167s may have a shallow junction compared to the second impurity region 167d. Furthermore, the first impurity region 167s may have an impurity density lower than that of the second impurity region 167d.

Furthermore, a high density channel impurity region 168 may be disposed below the second impurity region 167d. The high density channel impurity region 168 may have a conductivity type different from those of the first and second impurity regions 167s and 167d, and may have an impurity density higher than that of a channel region below the first impurity region 167s.

As discussed above, since the lower active gate electrode 155a is disposed in the active region A, a transistor may be provided having an increased effective channel length. Furthermore, since the lower field gate electrode 155b on the sidewalls of the active region located below the lower active gate electrode 155a is provided, a transistor may be provided having an increased channel width. Therefore, a field effect transistor capable of increasing an effective channel length and an effective channel width may be provided according to some embodiments of the present invention.

Figure 7:
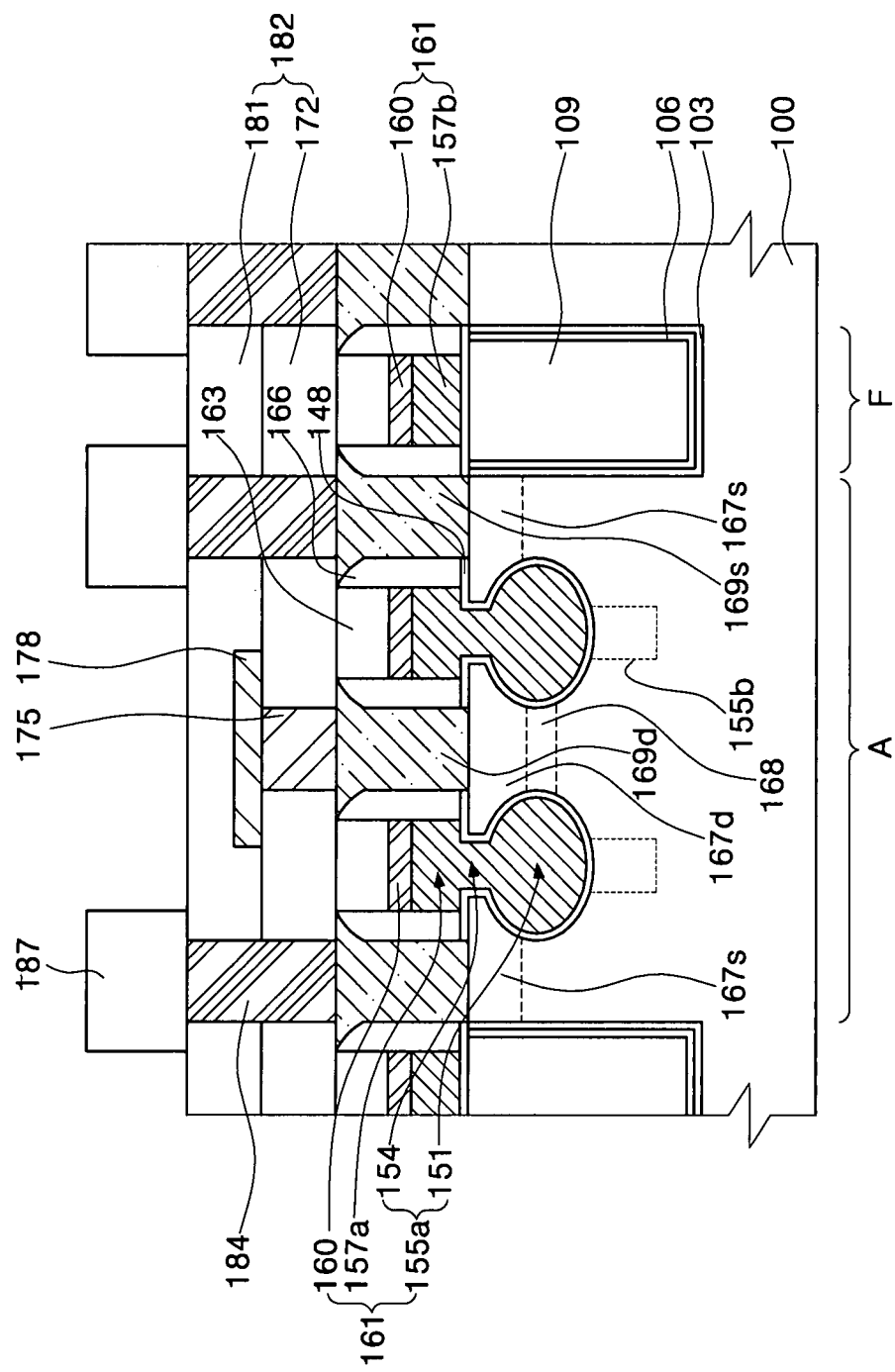

Referring now to FIG. 7, a data storage element 187, which is electrically coupled to the first impurity region 167s, may be provided. The data storage element 187 may include, for example, a lower electrode, a data storage media, and an upper electrode. In some embodiments of the present invention, the data storage media may be a capacitor dielectric layer or a resistance material layer.

A buried contact plug 184 may be provided between the data storage element 187 and the first impurity region 167s. A first landing pad 169s may be provided between the buried contact plug 184 and the first impurity region 167s.

A conductive line 178, which is electrically connected to the second impurity region 167d, may be provided. A direct contact plug 175 may be provided between the conductive line 178 and the second impurity region 167d. A second landing pad 169d may be provided between the direct contact plug 175 and the second impurity region 167d.

When the data storage element 187 includes a capacitor dielectric layer, semiconductor devices according to some embodiments of the present invention may be used for a memory device, such as a dynamic random access memory (DRAM). When the semiconductor device of the present invention is used for a memory device such as a DRAM, the electrical property of the memory device may be improved. In particular, since semiconductor devices according to some embodiments of the present invention may have an increased effective channel length, a short channel effect may be reduce or even suppressed, and since semiconductor devices according to some embodiments of the present invention may have an increased effective channel width, a current driving capability may be improved. Furthermore, since the transistor may be provided to have a fin structure, variation of threshold voltages by a body effect can be reduced even though the transistor has a recessed channel. Furthermore, since the gate electrode 161 may include a metal layer 160, it may be helpful to improve a signal transmission rate. Therefore, transistors having improved operating speeds while suppressing the short channel effect may be provided.

Furthermore, since the first impurity region 167s and the second impurity region 167d have an asymmetric structure, characteristics of the memory device can be improved. For example, since the first impurity region 167s has a shallow junction compared to the second impurity region 167d, and has a lower impurity density than that of the second impurity region 167d, the leakage current, which may occur in the junction of the first impurity region 167s, may be reduced. Therefore, refresh characteristics of the memory device may be improved.

Furthermore, since the high density channel impurity region 168 is provided below the second impurity region 167d, and an impurity density of the channel region below the first impurity region 167s is lower than that of the high density channel impurity region 168, the leakage current, which may occur in the junction of the first impurity region 167s, may be reduced. Therefore, electrical characteristics of the memory device can be improved.

Referring now to FIGS. 1, 11A, 11B, and 11C, semiconductor devices according to some embodiments of the present invention will be discussed. As illustrated therein, an isolation layer 109 is provided in a semiconductor substrate 100 having an active region A and a field region F. The isolation layer 109 may be provided in the semiconductor substrate of the field region F, so as to define a plurality of active regions A. An insulating liner 106 may be provided between the isolation layer 109 and the semiconductor substrate 100. A buffer oxide layer 103 may be provided between the insulating liner 106 and the semiconductor substrate 100. Upper gate electrodes UG, which cross the active region A and extend to the isolation layer 109, may be provided. In some embodiments, the upper gate electrode UG located on the active region A may be defined as an upper active gate electrode 257a, and the upper gate electrode UG located on the isolation layer 109 may be defined as an upper field gate electrode 257b.

A lower active gate electrode 255a is provided, and the lower active gate electrode 255a includes a first active gate electrode 254a that extends from the upper active gate electrode 257a to the substrate of the active region A, and a second active gate electrode 251a located below the first active gate electrode 254a and having a greater width than that of the first active gate electrode 254a. In some embodiments of the present invention, the second active gate electrode 251a may have a circular shape as illustrated in FIG. 11A. Thus, electric field crowding phenomenon between the second active gate electrode 251a and the active region A may be suppressed. Since the second active gate electrode 251a has a greater width than that of the first active gate electrode 254a, an effective channel length can be increased.

A lower field gate electrode 255b may be provided, and the lower field gate electrode 255b may include a first field gate electrode 245b that extends from the upper field gate electrode 257b to the isolation layer 109, and a second field gate electrode 251b located below the first field gate electrode 254b. The second field gate electrode may have a greater width than that of the first field gate electrode 254b.

The second field gate electrode 251b may have a bottom surface of a lower level than that of the second active gate electrode 251a. Here, the second field gate electrode 251b may be provided on the sidewalls of the active region located below the second active gate electrode 251a. An upper surface of the second field gate electrode 251b may be located at a level higher than a bottom surface of the second active gate electrode 251a.

As illustrated in FIGS. 11A and 11B, the first field gate electrode 254b has a bottom surface at a lower level than that of the first active gate electrode 254a. It will be understood that embodiments of the present invention are not limited to the configuration. For example, in some embodiments of the present invention, the first field gate electrode 254b and the first active gate electrode 254a may have bottom surfaces at a same level. Furthermore, the first field gate electrode 254b may have a bottom surface at a higher level than that of the first active gate electrode 254a. The level positions of the bottom surfaces of the first field gate electrode 254b and the first active gate electrode 254a may be designed appropriately in consideration of relations with impurity regions to be explained later.

The second field gate electrode 251b may be provided to have a greater width than that of the first active gate electrode 254a. Furthermore, the second field gate electrode 251b may be provided on the sidewalls of the active region located at both sides of the second active gate electrode 251a as well as to cover the sidewalls of the active region located below the second active gate electrode 251a. That is, the second field gate electrode 251b may be provided to have a greater width than that of the second active gate electrode 254. A gate dielectric layer 248 may be provided between the active region A and the gate electrode 261. The gate dielectric layer 248 may be, for example, a silicon oxide layer or a high-k dielectric layer.

First and second impurity regions 267s and 267d may be provided in the active region located at both sides of the gate electrode 261. The first impurity region 267s and the second impurity region 267d may have an asymmetric structure. For example, the first impurity region 267s may be provided to have a shallow junction compared to the second impurity region 267d. Furthermore, the first impurity region 267s may be provided to have an impurity density lower than that of the second impurity region 267d. In some embodiments of the present invention, the first and second impurity regions 267s and 267d may be defined as source and drain regions, respectively.

Furthermore, a high-density channel impurity region 268 may be provided below the second impurity region 267d. The high-density channel impurity region 268 has a conductivity type different from those of the first and second impurity regions 267s and 267d, and may have an impurity density higher than that of the channel region below the first impurity region 267s.

As discussed above, since the lower active gate electrode 255a is provided in the active region A, transistors may be provided having an increased effective channel length. Furthermore, since the lower field gate electrode 255b is provided to cover the sidewalls of the active region located below the lower active gate electrode 255a, transistors having an increased channel width may be provided. Therefore, a recess fin field effect transistor capable of increasing an effective channel width as well as an effective channel length may be provided according to some embodiments of the present invention.

Since the lower field gate electrode 255b includes the first field gate electrode 245b, and the second field gate electrode 251b has a greater width than that of the first field gate electrode 254b, the first and second impurity regions 267s and 267d may not overlap the lower field gate electrode 255b. Since the sidewalls of the active region of the first and second impurity regions 267s and 267d may not overlap the lower field gate electrode 255b, the electric field occurring between the first and second impurity regions 267s and 267d, and the lower field gate electrode 255b can be suppressed. As a result, the variance of the threshold voltage of the transistor can be reduced according to some embodiments of the present invention. Therefore, the electrical characteristics of transistors according to some embodiments of the present invention may be improved.

Although not illustrated in the Figures, a data storage element, which is electrically connected to the first impurity region 267s, may be provided. The data storage element may be substantially similar to the data storage element, which was discussed above with respect to FIG. 7. Since occurrence of an electric field between the first impurity region 267s and the lower field gate electrode 255b may be suppressed, the leakage current generated in the first impurity region 267s may be reduced. Therefore, the refresh characteristics of the memory device, such as a DRAM, may be improved.

Referring now to FIG. 12, semiconductor devices according to some embodiments of the present invention will be discussed. Transistors according to embodiments of the present invention illustrated in FIG. 12 are similar to transistors discussed above with reference to FIGS. 1, 6A, 6B, and 6C. In particular, a gate electrode 361 having a recessed channel in an active region of a semiconductor substrate 100 is provided. In some embodiments of the present invention, the active region may be surrounded by an isolation layer. The gate electrode 361 may include, for example, a lower active gate electrode 355a provided in the active region, an upper gate electrode 357 protruding from an upper surface of the active region, and a metal layer 360 provided on the upper gate electrode 357. The upper gate electrode 357 may extend to the isolation layer. The lower active gate electrode 355a may include a first active gate electrode 354, and a second active gate electrode 351 located below the first active gate electrode 354 and having a greater width than that of the first active gate electrode 354.

A lower field gate electrode 355b, which extends into the isolation layer from the upper gate electrode 357 located on the isolation layer, may be provided. The lower field gate electrode 355b may be provided on selected ones of the sidewalls of the active region located at both sides of the lower active gate electrode 355a as well as the sidewalls of the active region located below the lower active gate electrode 355a.

First and second impurity regions 367s and 367d may be provided in the active region at both sides of the gate electrode 361. The first and second impurity regions 367s and 367d may have an asymmetric structure like the asymmetric structure of the first and second impurity regions 167s and 167d explained in reference to FIGS. 1, 6A, 6B, and 6C. Further, although not illustrated in the Figures, a high density channel impurity region may be provided below the second impurity region 367d. Furthermore, a data storage element, which is electrically connected to the first impurity region 367s, may be provided. The data storage element may be substantially the same as the data storage element discussed above with respect to FIG. 7.

When the data storage element including a capacitor dielectric layer is electrically connected to the first impurity region 367s, since the lower field gate electrode 355b does not typically overlap the first impurity region 367s, the leakage current, which may be generated in the first impurity region 367s, can be reduced and, thus, the refresh characteristics of the memory device, such as a DRAM, may be improved. Furthermore, since selected ones of the sidewalls of the active region located at both sides of the lower active gate electrode 355a is covered, a fin effect can be improved.

Methods of fabricating semiconductor devices according to some embodiments of the present invention will now be discussed with reference to FIGS. 1 and 2A through 6C. Referring first to FIGS. 1, 2A, 2B and 2C, a semiconductor substrate 100 is prepared. Regions of the semiconductor substrate 100 may be divided into an active region A and a field region F. An isolation layer 109 for defining the active region A is formed in the substrate of the field region F. The active region A has a major axis and a minor axis, and the active regions A may be aligned two-dimensionally in the major axis direction and the minor axis direction.

The isolation layer 109 may be formed using a trench isolation technique. In particular, the formation of the isolation layer 109 may include forming a trench in the substrate of the field region F, and forming an insulating layer filling the trench. After the trench is formed in the substrate of the field region F, a buffer oxide layer 103 and an insulating liner 106 may be sequentially formed on the inner wall of the trench.

A sacrificial mask 130 having an opening 130a crossing the active region A and extending to the isolation layer 109 may be formed on the substrate having the isolation layer 109. The sacrificial mask 130 may be formed to include a pad insulating layer 121, a lower sacrificial mask 124, and an upper sacrificial mask 127, which are sequentially stacked. Here, the pad insulating layer 121 may include, for example, a silicon oxide layer, and the lower sacrificial mask 124 may include, for example, an insulating layer, such as a silicon nitride layer or a silicon oxynitride (SiON) layer. The upper sacrificial mask 127 may include, an insulating layer, such as an amorphous carbon layer.

The opening 130a of the sacrificial mask 130 may be formed to have a pocket structure. In other words, the isolation layer exposed by the opening 130a is a region in adjacent to the active region A, and the isolation layer disposed between the active regions A, which are aligned in the major axis, may be covered by the sacrificial mask 130.

Referring now to FIGS. 1, 3A, 3B, and 3C, the active region A exposed by the opening 130a, and the isolation layer 109 are etched using the sacrificial mask 130 as an etch mask, so as to form an upper active trench 133 and a field trench 136. The bottom surface of the field trench 136 may be formed to have a level lower than that of the upper active trench 133. The upper active trench 133 and the field trench 136 may be formed using an anisotropic etch process showing a high etch rate with respect to the active region A and the isolation layer 109.

Furthermore, the upper active trench 133 and the field trench 136 may be formed by performing a first etch process using a first anisotropic etch process having a high etch rate with respect to either one of the active region A and the isolation layer 109, and by performing a second etch process using a second anisotropic etch process having a high etch rate with respect to a remaining one.

After the isolation layer 109 exposed by the opening 130a is etched, so as to form the field trench 136, the insulating liner and the buffer insulating layer, which are exposed by the field trench 136, may be removed.

Meanwhile, while the upper active trench 133 and the field trench 136 are formed, the upper sacrificial mask 127 may be removed.

Referring to FIGS. 1, 4A, 4B and 4C, sidewall spacers 139 may be formed on the sidewalls of the upper active trench 133 and the field trench 136. Here, the sidewall spacers 139 may be formed to cover the sidewalls of the exposed active region A. The sidewall spacers 139 may be formed of an insulating layer such as a silicon oxide layer, or a silicon nitride layer.

The active region A may be etched, using the sidewall spacers 139, the sacrificial mask 130, and the isolation layer 109 as etch masks. Here, the etching of the active region A using the sidewall spacers 139, the sacrificial mask 130, and the isolation layer 109 as etch masks may include an isotropic etch process. As a result, a lower active trench 142 having a greater width than that of the upper active trench 133 may be formed below the upper active trench 133. Here, the lower active trench 136 may be formed with a circular shape.

Referring to now to FIGS. 1, 5A, 5B, and 5C, the sacrificial mask 130 and the sidewall spacers 139 are removed. Thus, the upper active trench 133 and the lower active trench 142 in the active region A may be exposed, and the sidewalls of the active region located below the lower active trench 142 may be exposed. That is, the sidewalls of the active region located below the lower active trench 142 may be exposed by the field trench 136. Here, the upper active trench 133 and the lower active trench 142 may form an active trench 145. The active trench 145 and the field trench 136 may form a gate trench.

Referring now to FIGS. 1, 6A, 6B, and 6C, a conductive layer and a hard mask 163 may be formed on the substrate having the active trench 145 and the field trench 136, and the conductive layer may be etched using the hard mask 163 as an etch mask. As a result, a gate electrode 161 covering the sidewalls of the active region located below the active trench 145 may be formed while filling the active trench 145 and the field trench 136. Here, the gate electrode 161 may be formed to have a protrusion higher than an upper surface of the active region A.

The gate electrode 161 crossing the active region A may include, for example, an upper active gate electrode 157a crossing the active region A, and a lower active gate electrode 155a filling the active trench 145. Here, the lower active gate electrode 155a may include, for example, a first active gate electrode 154, and a second active gate electrode 151 located below the first active gate electrode 154 and having a greater width than that of the first active gate electrode 154.

The gate electrode 161 extending from the active region A to the isolation layer 109 may include, for example, an upper field gate electrode 157b located on the isolation layer 109, and a lower field gate electrode 155b located in the isolation layer 109 and cover the sidewalls of the active region located below the lower active gate electrode 155a.

The gate electrode located between the active regions A aligned in the major axis direction may include, for example, an upper field gate electrode 157b.

The gate electrode 161 may include, for example, a metal layer 160, which is formed on the upper active gate electrode 157a and the upper field gate electrode 157b. The metal layer 160 may be, for example, a tungsten layer, a nickel layer, a cobalt layer, a titanium layer, or a metal silicide layer.

Before the gate electrode 161 is formed, a gate insulating layer 148 may be formed on the substrate having the active trench 145 and the field trench 136. The gate insulating layer 148 may include, for example, a silicon oxide layer or a high-k dielectric layer. The gate insulating layer 148 may be formed using a semiconductor fabrication process, such as thermal oxidation, chemical vapor deposition (CVD), or atomic layer deposition (ALD).

Gate spacers 166 covering the sidewalls of the gate electrode 161 may be formed. The gate spacers 166 may include, for example, an insulating layer, such as a silicon nitride layer.

A first impurity region 167s and a second impurity region 167d may be formed on the active region at both sides of the gate electrode 161. The first impurity region 167s and the second impurity region 167d may be formed to have an asymmetric structure. For example, the first impurity region 167s may be formed to have a shallow junction compared to the second impurity region 167d. Furthermore, the first impurity region 167s may be formed to have a higher impurity density than that of the second impurity region 167d. The first impurity region 167s and the second impurity region 167d may be formed to have a first conductivity type.

A high density channel impurity region 168 may be formed in the channel region below the second impurity region 167d. Here, the high density channel impurity region 168 may be formed to have a higher impurity density than that of the channel region below the first impurity region 167s.

The first and second impurity regions 167s and 167d, and the high density channel impurity region 168 may be formed before the sacrificial mask 130 is formed. For example, after the first and second impurity regions 167s and 167d, and the high density channel impurity region 168 are first formed by implanting impurity ions into predetermined regions of the active region A, a process of forming the sacrificial mask 130 may be performed.

Thus, transistors, which comprise the first and second impurity regions 167s and 167d, and the gate electrode 161, may be formed. That is, recess fin field effect transistors having a recessed channel structure and a fin structure may be formed.

As illustrated in FIG. 7, a data storage element 187, which is electrically connected to the first impurity region 167s, may be formed on the substrate having the transistors. In particular, a normal self-align contact process is performed on the substrate having the transistors, thereby forming a first landing pad 169s and a second landing pad 169d, which respectively contact the first impurity region 167s and the second impurity region 167d. A lower interlayer insulating layer 172 may be formed on the substrate having the first and second landing pads 169s and 169d. A direct contact plug 175 contacting the second landing pad 169d through the lower interlayer insulating layer 172 may be formed. A conductive line 178 covering the direct contact plug 175 may be formed on the lower interlayer insulating layer 172. The conductive line 178 may be formed to have the direction crossing the gate line 161. An upper interlayer insulating layer 181 may be formed on the substrate having the conductive line 178. The upper interlayer insulating layer 181 and the lower interlayer insulating layer 172 may form an interlayer insulating layer 182.

A buried contact plug 184 contacting the first landing pad 169s through the interlayer insulating layer 182 may be formed.

A data storage element 187 covering the buried contact plug 184 may be formed on the interlayer insulating layer 182. The data storage element 187 may comprise a capacitor dielectric layer. Thus, the semiconductor device of the present invention may be used in a memory device such as a DRAM.

The data storage element 187 may include a nonvolatile data storage media. Here, the nonvolatile data storage media may include a resistance material layer, such as a phase change material layer.

Processing steps in the fabrication of semiconductor devices according to some embodiments of the present invention will now be discussed with respect to FIGS. 1, and 8A through 11C. Referring first to FIGS. 1, 8A, 8B, and 8C, a substrate 100 having an active region A and a field region F is prepared. As discussed above with respect to FIGS. 2A, 2B, and 2C, a buffer oxide layer 103, an insulating liner 106, an isolation layer 109, and a sacrificial mask 130 may be formed in the substrate 100.

The active region A and the isolation layer 109 are etched using the sacrificial mask 130 as an etch mask, thereby forming an upper active trench 233 and an upper field trench 236. In this case, the upper active trench 233 may be formed to have a bottom surface of a first depth Da1, and the upper field trench 236 may be formed to have a bottom surface of a second depth Da2. The second depth Da2 is deeper than the first depth Da1. In particular, the upper active trench 233 and the upper field trench 236 may be formed using, for example, an anisotropic etch process showing a high etch rate with respect to the active region A and the isolation layer 109. In some embodiments of the present invention, the upper active trench 233 and the upper field trench 236 may be formed by performing a first etch process using a first anisotropic etch process having a high etch rate with respect to either one of the active region A and the isolation layer 109, and then, by performing a second etch process using a second anisotropic etch process having a high etch rate with respect to a remaining one.

Figure 8A:
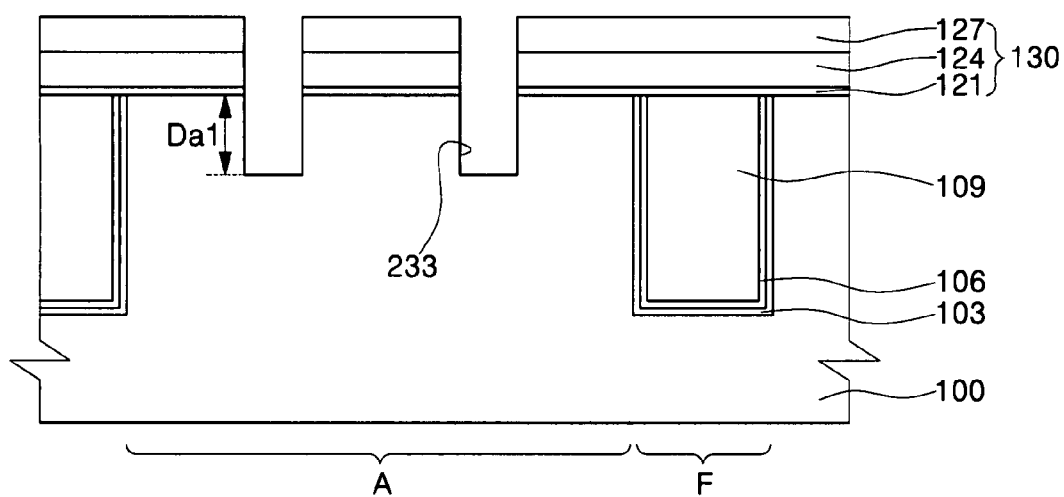
FIGS. 8A through 11C are cross-sections illustrating semiconductor devices according to some embodiments of the present invention.
Figure 8B:
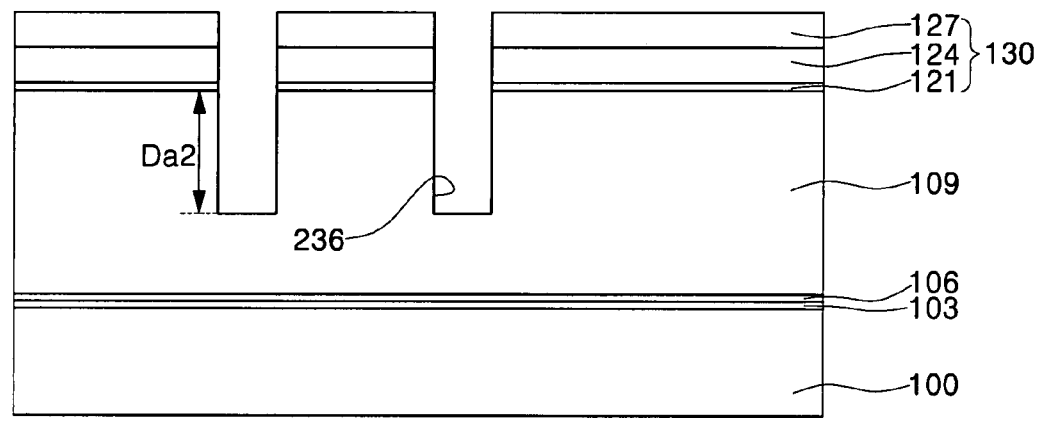
Figure 8C:
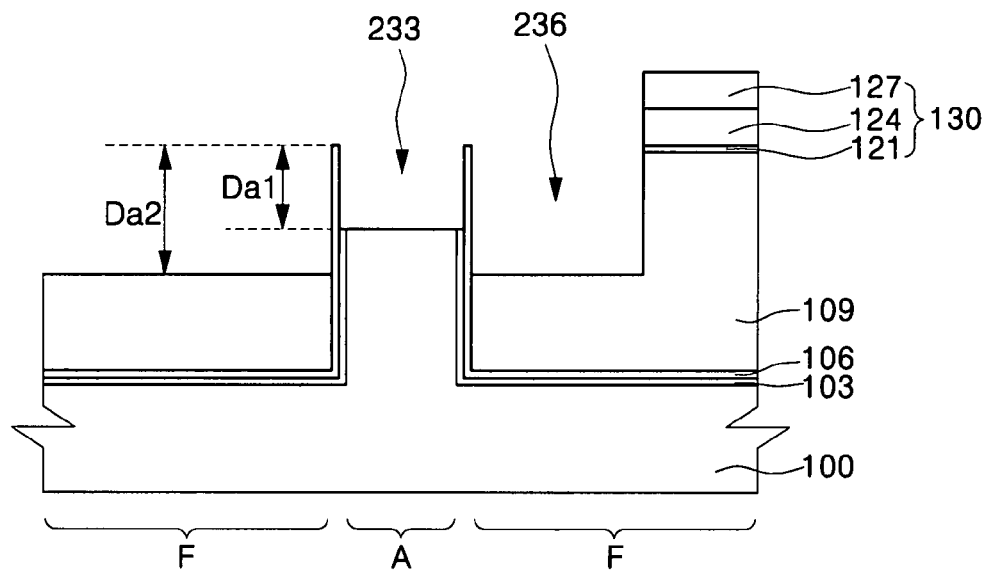
Figure 9A:
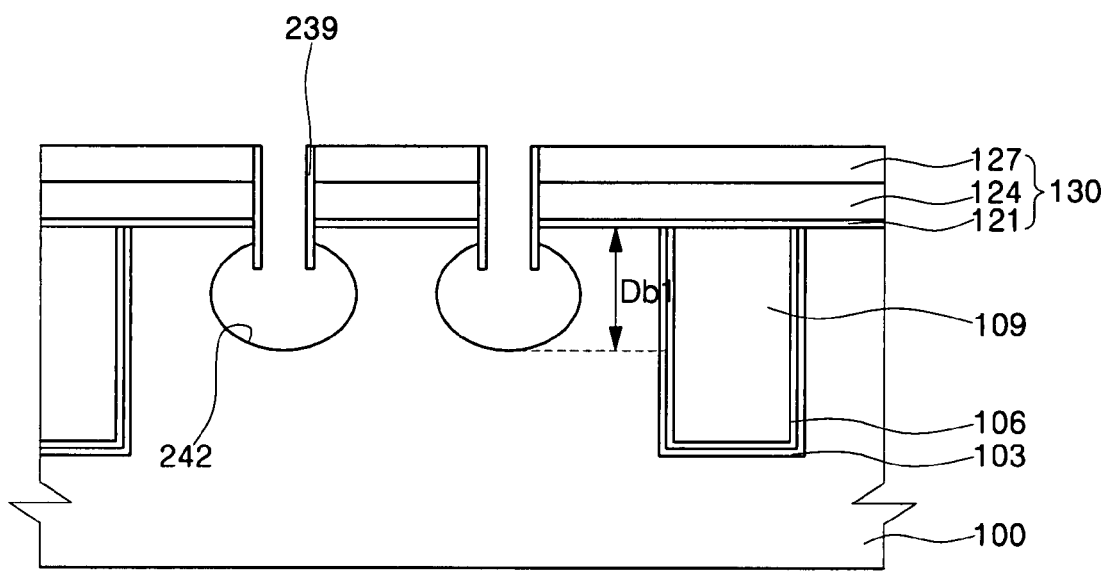
Figure 9B:
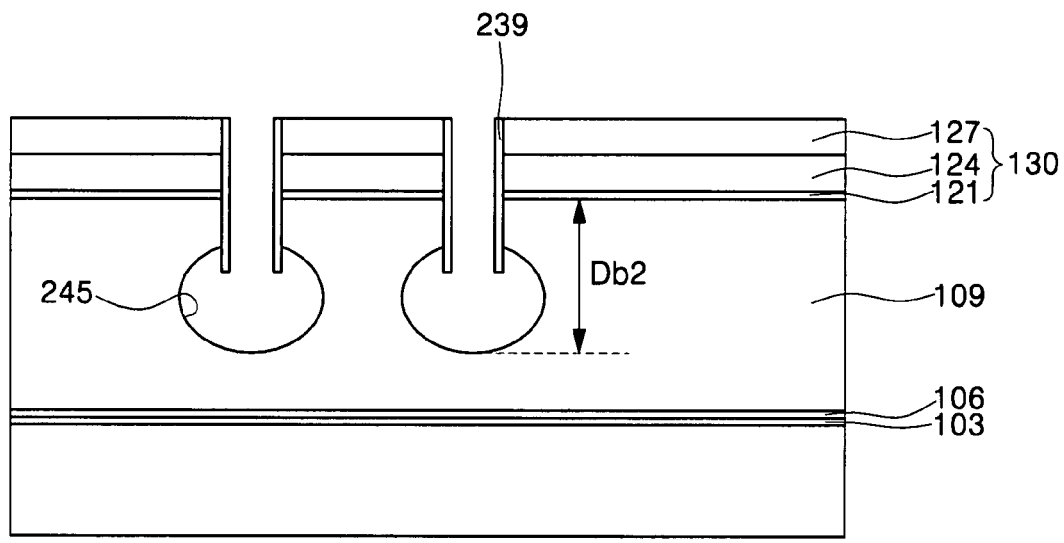
Figure 9C:
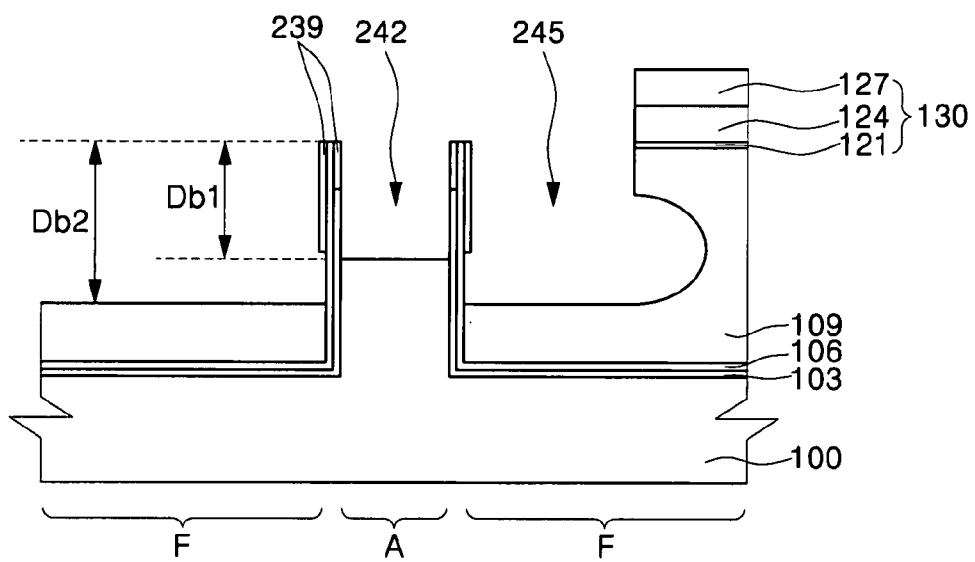
Figure 10A:
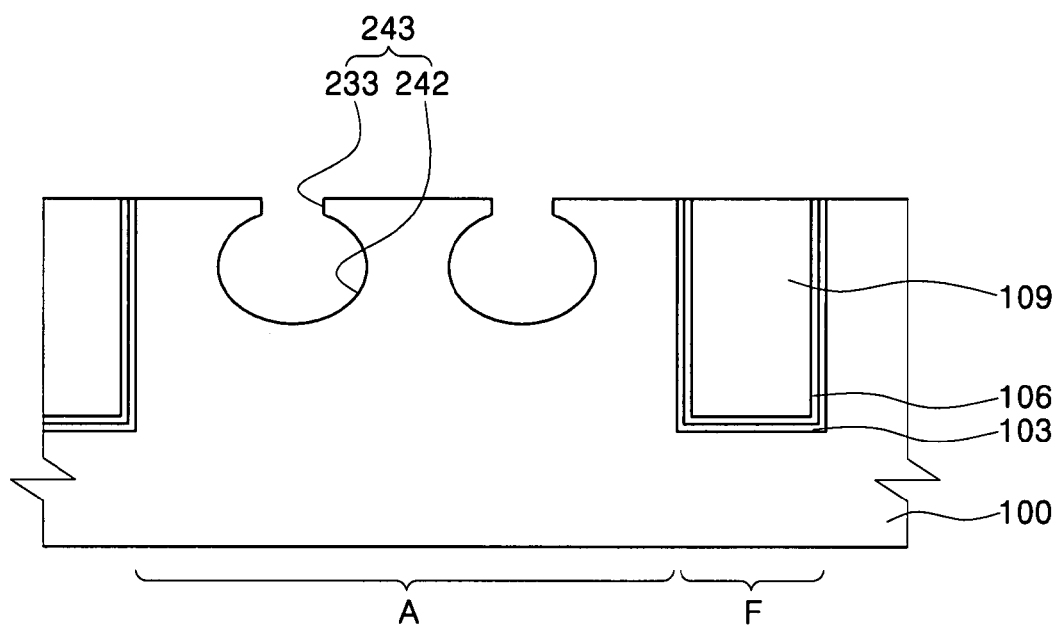
Figure 10B:
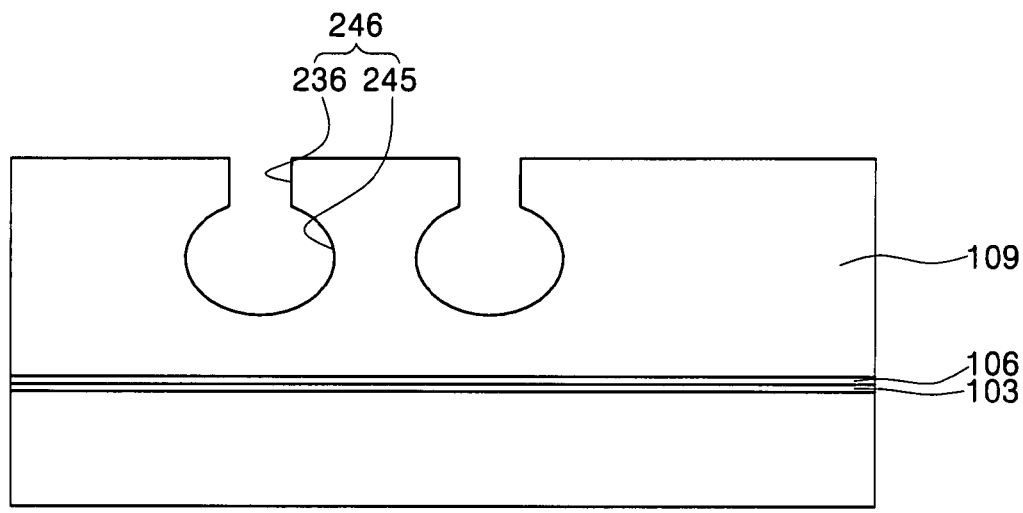
Figure 10C:
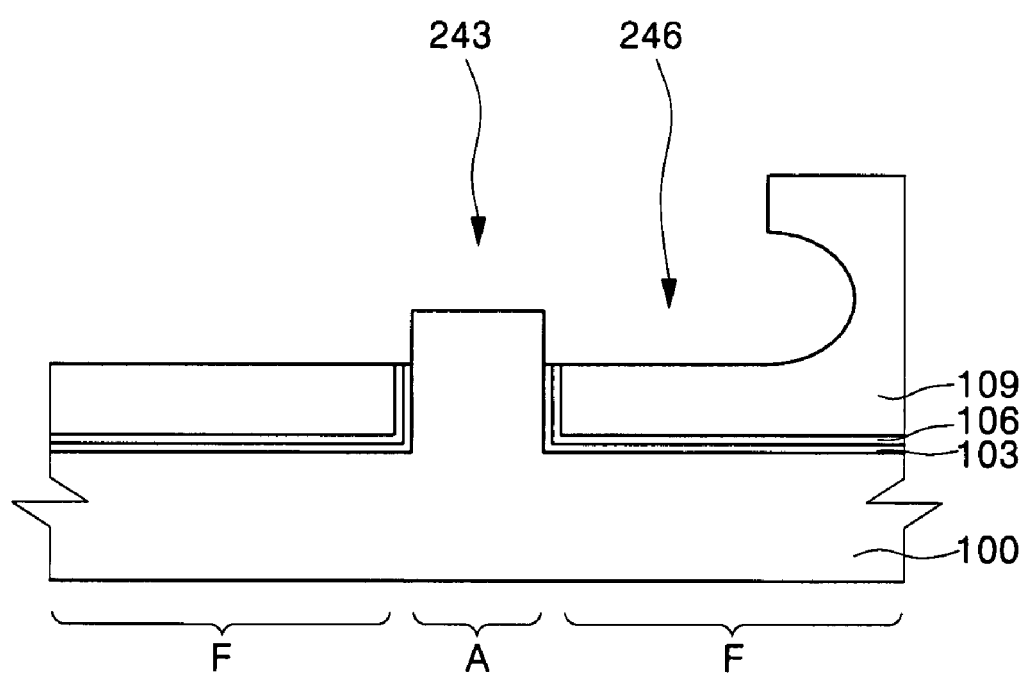

As illustrated in FIG. 8C, the buffer oxide layer 103, which is exposed by forming the upper active trench 233, may be removed. The buffer oxide layer 103, which is exposed by forming the upper active trench 233, may be removed while the upper active trench 233 and the upper field trench 236 are formed.

Referring now to FIGS. 1, 9A, 9B, and 9C, sidewall spacers 239 may be formed to cover the sidewalls the upper active trench 233 and the upper field trench 236. The sidewall spacers 239 may be formed of a material layer having an etch selectivity with respect to the active region A and the isolation layer 239. For example, when the active region A is formed of a silicon substrate, and the isolation layer 239 is formed of a silicon oxide layer, the sidewall spacers 239 may be formed of a silicon nitride layer or a silicon oxynitride layer (SiON).

The active region A and the isolation layer 109 are etched using the sacrificial mask 130 and the sidewall spacers 239 as etch masks, thereby forming a lower active trench 242 having a greater width than that of the upper active trench 233, and a lower field trench 245 having a greater width than that of the upper field trench 236. The lower field trench 245 may be formed to have a bottom surface at a lower level than that of the lower active trench 242. That is, the lower active trench 242 may be formed to have a bottom surface at a third depth Db1, and the lower field trench 245 may be formed to have a bottom surface at a fourth depth Db2. The fourth depth may be deeper than the third depth Db1. In particular, the lower active trench 242 and the lower field trench 245 may be formed using an isotropic etch process showing a high etch rate with respect to the active region A and the isolation layer 109. Alternatively, the lower active trench 242 and the lower field trench 245 may be formed by performing a first etch process using a first isotropic etch process having a high etch rate with respect to either one of the active region A and the isolation layer 109, and then, by performing a second etch process using a second isotropic etch process having a high etch rate with respect to a remaining one.

Referring now to FIGS. 1, 10A, 10B, and 10C, the sacrificial mask 130 and the sidewall spacers 239 may be removed. Furthermore, the insulating liner 106 and the buffer oxide layer 103, which are exposed by the lower field trench 245, may be removed. As a result, the sidewalls of the active region located below the lower active trench 242 may be exposed. Therefore, the active region located below the lower active trench 242 may be formed to have a fin structure.

The upper active trench 233 and the lower active trench 242 may form an active trench 243, and the upper field trench 236 and the lower field trench 245 may form a field trench 246.

Referring now to FIGS. 1, 11A, 11B, and 11C, a conductive layer and a hard mask 263 may be formed on the substrate having the active trench 243 and the field trench 246. The conductive layer may be etched using the hard mask 263 as an etch mask. As a result, a gate electrode 261 may be formed to fill the active trench 243 and the field trench 246, and to cover the sidewalls of the active region located below the active trench 243. Here, the gate electrode 261 may be formed to have a protrusion being higher than an upper surface of the active region A.

The gate electrode 261 crossing the active region A may comprise an upper active gate electrode 257a crossing the active region A, and a lower active gate electrode 255a filling the active trench 243. Here, the lower active gate electrode 255a may comprise a first active gate electrode 254a, and a second active gate electrode 251a located below the first active gate electrode 254a and having a greater width than that of the first active gate electrode 254a.

The gate electrode 261 extending from the active region A to the isolation layer 109 may include, for example, an upper field gate electrode 257b on the isolation layer 109, and a lower field gate electrode 255b located in the isolation layer 109 and covering the sidewalls of the active region located below the lower active gate electrode 255a. In some embodiments of the present invention, the lower field gate electrode 255b may include, for example, a first field gate electrode 254b, and a second field gate electrode 251b located below the first field gate electrode 254b and having a greater width than that of the first field gate electrode 254b. The second field gate electrode 251b may have a bottom surface having a lower level than that of the second active gate electrode 251a, and may cover the sidewalls of the active region located below the second active gate electrode 251a.

The gate electrode, which is located between the active regions A aligned in the major axis direction, may include, for example, an upper field gate electrode 257b.

The gate electrode 261 may include, for example, a metal layer 260 formed on the upper active gate electrode 257a and the upper field gate electrode 257b. The metal layer 260 may be, for example, a cobalt layer, a nickel layer, a tungsten layer, a titanium layer, or a metal silicide layer.

Before the gate electrode 261 is formed, a gate insulating layer 248 may be formed on the substrate having the active trench 243 and the field trench 246. The gate insulating layer 248 may be formed of a silicon oxide layer, or a high-k dielectric layer. The gate insulating layer 248 may be formed using a semiconductor fabrication process, such as thermal oxidation, chemical vapor deposition (CVD), or atomic layer deposition (ALD).

Gate spacers 266 may be formed to cover the sidewalls of the gate electrode 261. The gate spacer 266 may include an insulating layer, such as a silicon nitride layer.

A first impurity region 267s and a second impurity region 267d may be formed in the active region at both sides of the gate electrode 261. The first impurity region 267s and the second impurity region 267d may be formed to have an asymmetric structure. For example, the first impurity region 267s may be formed to have a shallow junction compared to the second impurity region 267d. The first impurity region 267s may be formed to have a lower impurity density than that of the second impurity region 267d. The first and second impurity regions 267s and 267d may be formed to have a first conductivity type.

A high density channel impurity region 268 may be formed in the channel region below the second impurity region 267d. In some embodiments of the present invention, the high density channel impurity region 268 may be formed to have a higher impurity density than that of the channel region located below the first impurity region 267s.

Meanwhile, the first and second impurity regions 267s and 267d, and the high density channel impurity region 268 may be formed before the sacrificial mask 130 is formed. For example, after the first and second impurity regions 267s and 267d, and the high density channel impurity region 268 may be formed first by implanting impurity ions into predetermined regions of the active region A, a process of forming the sacrificial mask 230 may be performed.

Furthermore, a data storage element, which is electrically connected to the first impurity region 267s, may be formed using processing steps discussed above with respect to FIG. 7.

Referring now to FIG. 12, processing steps in the fabrication of semiconductor devices according to some embodiments of the present invention will be discussed. As illustrated in FIG. 12, a gate electrode 361 is formed to have a lower active gate 355a located in an active region of a semiconductor substrate 100. Furthermore, the gate electrode is formed to have a lower field gate electrode 355b covering the sidewalls of the active region located at both sides of the lower active gate electrode 355a as well as covering the sidewalls of the active region located below the lower active gate electrode 355a. The gate electrode 361 may further include an upper gate electrode 357, which protrudes from an upper surface of the active region. Here, the lower active gate electrode 355a may include, for example, a first active gate electrode 354, and a second active gate electrode 351, which is located below the first active gate electrode 354 and has a greater width than that of the first active gate electrode 354. Furthermore, the gate electrode 361 may include a metal layer 360 formed on the upper gate electrode 357.

Processing steps in the formation of the gate electrode 361 are similar to those discussed above with respect to the gate electrode 161 of FIGS. 2A through 7. However, the mask used for etching the active region and the mask used for etching the isolation layer are different. In particular, the sacrificial mask 130 as discussed above with respect to FIGS. 2A, 2B, and 2C may be used as a first mask etching the active region. As a result, the active trench 145 as discussed above with respect to FIG. 5A may be formed. Furthermore, a second mask for etching the isolation layer is formed. Here, the second mask may be formed to have an opening exposing a predetermined region of the isolation layer. The isolation layer is etched using the second mask as an etch mask, thereby forming a field trench exposing one of the sidewalls of the active region located at both sides of the active trench 145 as well as exposing the sidewalls of the active region located below the active trench 145 as illustrated in FIG. 5A. A gate electrode 361 may be formed to cover one of the sidewalls of the active region located at both sides of the active trench as well as covering the sidewalls of the active region located below the active trench.

Before the gate electrode 361 is formed, a gate dielectric layer 348 may be formed. A hard mask 363 may be formed on the gate electrode 361. Furthermore, gate spacers 366 may be formed to cover both sidewalls of the gate electrode 361.

First and second impurity regions 367s and 367d may be formed in the active region at both sides of the gate electrode 361. The first and second impurity regions 367s and 367d may be formed to have an asymmetric structure. For example, the first impurity region 367s may be formed to have a shallow junction compared to the second impurity region 367d. The first impurity region 367s may be formed to have a lower impurity density than that of the second impurity region 367d. Although not illustrated in the Figures, a high density channel impurity region may be formed in the channel region below the second impurity region 367d. The high density channel impurity region 268 may be formed to have a higher impurity density than that of the channel region located below the first impurity region 267s.

As discussed above, some embodiments of the present invention provide a transistor that may be capable of reducing the occurrence of the body effect while including a recessed channel. The transistor can suppress a short channel effect. Furthermore, since the transistor has an increased channel width, the transistor can increase a driving current capability. In other words, the operating speed of the device may be improved. Furthermore, the transistor may reduce or possible suppress deterioration of the transistor performance due to the body effect.

The gate electrode of the transistor may include a metal layer. Therefore, the semiconductor device using the transistor may improve signal transmission speed.

Furthermore, since the transistor has an asymmetric structure of the source region and the drain region, electrical properties of the memory device may be improved. In other words, since the impurity density of the source region is lower than that of the drain region, and the impurity density of the channel region below the source region is lower than that of the channel region below the drain region, refresh characteristics of the memory device, such as DRAM, can be improved.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating semiconductor devices, the method comprising:
forming an isolation layer in a semiconductor substrate, the isolation layer defining an active region of the semiconductor substrate;
forming a gate trench including an active trench crossing over the active region and a field trench extending from the active trench to the isolation layer, wherein the active trench includes an upper active trench and a lower active trench below the upper active trench and having a greater width than a width of the upper active trench and wherein the field trench has a bottom surface that is lower than a bottom surface of the lower active trench, wherein a width of the lower active trench is greater than a width of the field trench; and
forming a gate electrode filling the gate trench and covering sidewalls of the active region below the active trench, wherein the gate electrode includes an upper active gate electrode to fill the upper active trench, a lower active gate electrode to fill the lower active trench, and a field gate electrode to fill the field trench, wherein a width of the lower active gate electrode is greater than a width of the field gate electrode; wherein the forming of the lower active trench comprises: isotropically etching a portion of the active region, thereby forming the lower active trench having a greater width than the width of the upper active trench and the lower active trench having the bottom surface that is higher than the bottom surface of the field trench.

2. The method of claim 1, wherein the forming of the gate trench comprises:
forming a sacrificial mask having an opening crossing over the active region on the semiconductor substrate including the isolation layer and extending to the isolation layer;
etching the isolation layer and the active region using the sacrificial mask as an etch mask to form the field trench and the upper active trench, wherein a bottom surface of the field trench is lower than a bottom surface of the upper active trench;
forming sidewall spacers covering the field trench and the upper active trench;
isotropically etching the active region using the isolation layer, the sacrificial mask, and the sidewall spacers as an etch mask, to form the lower active trench; and
removing the sidewall spacers and the sacrificial mask.

3. The method of claim 2, wherein the opening has a pocket shape.

4. A method of fabricating semiconductor devices, the method comprising:
forming an isolation layer in a semiconductor substrate, the isolation layer defining an active region of the semiconductor substrate;
forming a gate trench including an active trench crossing over the active region and a field trench extending from the active trench to the isolation layer, wherein the active trench includes an upper active trench and a lower active trench below the upper active trench and having a greater width than a width of the upper active trench and wherein the field trench has a bottom surface that is lower than a bottom surface of the lower active trench, wherein the field trench comprises an upper field trench and a lower field trench below the upper field trench and wherein the lower field trench has a greater width than a width of the upper field trench;
forming a gate electrode filling the gate trench and covering sidewalls of the active region below the lower active trench, wherein the gate electrode includes an upper active gate electrode to fill the upper active gate trench, a lower active gate electrode to fill the lower active trench, an upper field gate electrode to fill the upper field trench, and a lower field gate electrode to fill the lower field trench, wherein the lower field gate electrode has a greater width than a width of the upper field gate electrode.

5. The method of claim 4, wherein the forming of the gate trench comprises:
forming a sacrificial mask having an opening crossing over the active region and extending to the isolation layer;
etching the active region and the isolation layer using the sacrificial mask as an etch mask to provide the upper active trench and an upper field trench, wherein the upper active trench is formed to have a bottom surface of a first depth, and the upper field trench is formed to have a bottom surface of a second depth, wherein the second depth is deeper than the first depth;

forming sidewall spacers covering sidewalls of the upper active trench and the upper field trench;

isotropically etching the active region and the isolation layer using the sacrificial mask and the sidewall spacers as an etch mask to provide the lower active trench and the lower field trench, wherein the lower active trench has a bottom surface located between an upper surface and a bottom surface of the lower field trench; and removing the sidewall spacers and the sacrificial mask.

6. The method of claim 5, wherein the lower field trench has a greater width than a width of the lower active trench.

7. The method of claim 1, wherein the gate electrode has an upper surface that is higher than an upper surface of the active region.

8. The method of claim 1, further comprising forming a first impurity region and a second impurity region in the active region on both sides of the gate electrode, wherein the first impurity region and the second impurity region have an asymmetric structure.

9. The method of claim 8, wherein the first impurity region has a shallow junction structure relative to a junction structure of the second impurity region.

10. The method of claim 8, wherein the first impurity region has an impurity density lower than an impurity density of the second impurity region.

11. The method of claim 8, further comprising forming a high density channel impurity region having a different conductivity type from a conductivity type of the first and second impurity regions in a channel region below the second impurity region.

12. The method of claim 1, further comprising forming a data storage element electrically connected to one of the active regions located on both sides of the gate electrode.

13. The method of claim 1, further comprising:

after forming the gate trench, forming an insulating liner on an inner wall of the gate trench;

while forming the field trench, exposing a portion of the insulating liner; and before forming the lower active trench, removing the exposed portion of the insulating liner to expose a portion of sidewalls of the active region.

14. The method of claim 4, further comprising:

after forming the gate trench, forming an insulating liner on an inner wall of the gate trench;

while forming the field trench, exposing a portion of the insulating liner; and before forming a gate electrode, removing the exposed portion of the insulating liner to expose a portion of sidewalls of the active region.

* * * * *